(12) United States Patent
Karabatsos

(10) Patent No.: US 7,561,651 B1
(45) Date of Patent: Jul. 14, 2009

(54) SYNCHRONIZATION OF A DATA OUTPUT SIGNAL TO A CLOCK INPUT

(76) Inventor: Chris Karabatsos, 12 Van Keuren Hwy., Kingston, NY (US) 12401

( * ) Notice: Subject to any disclaimer, the term of this patent is extended or adjusted under 35 U.S.C. 154(b) by 359 days.

(21) Appl. No.: 11/733,254

(22) Filed: Apr. 10, 2007

Related U.S. Application Data

(63) Continuation-in-part of application No. 11/308,518, filed on Mar. 31, 2006, now Pat. No. 7,276,982.

(60) Provisional application No. 60/797,172, filed on May 4, 2006.

(51) Int. Cl.
*H04L 7/00* (2006.01)
(52) U.S. Cl. ........................ 375/371; 375/373
(58) Field of Classification Search .................. 375/355, 375/371, 373, 376
See application file for complete search history.

(56) References Cited

U.S. PATENT DOCUMENTS 6,917,660 B2 * 7/2005 Song ........................... 375/373
7,206,370 B2 * 4/2007 Nakao ......................... 375/376

* cited by examiner

*Primary Examiner*—David B Lugo
(74) *Attorney, Agent, or Firm*—Mark P. White

(57) ABSTRACT

A method for synchronizing an output signal of a device phase aligned with an input clock includes the steps of providing an oscillator signal having a period $\Pi n$ of $1/(f1*2^n)$, wherein f1 is the clock frequency, and wherein the oscillator signal is phase aligned with the input clock signal, so a multiple of the clock frequency is produced. A number of delayed signals are generated, each having the same period as the input clock signal, but delayed by multiples of one-half the oscillator period from the input clock. The phase difference between the unadjusted output signal each delayed signal is determined, and the smallest value of the phase difference calculated. This smallest phase difference value is then added to the clock signal, resulting in a delayed clock, which is then used to generated the delayed output signal, which will be in close synchronization with the input clock.

7 Claims, 32 Drawing Sheets

VARIABLE HIGH FREQUENCY DIGITAL OSCILLATOR BLOCK DIAGRAM

RING OSCILLATOR

LOGIC SMBOLS
A = AND
N = INVERT
O = OR
⊠ = PASS GATE
▷ = Lo Level
—— = Hi Level

GATED RING OSCILLATOR with DELAY or LOAD

NOTE 1: A wedge at the output or at the input of a logic block indicates a low logic signal level. A line without a wedge indicates a Hi signal logic level.

NOTE 2: A letter within the logic block indicates the function of the block

INCREMENTAL DELAY SELECTION from Fig. 3

* BULK DELAY TO BE ADDED TO PERIOD BULK DELAY SELECTION

SYNCHRONIZATION OF A DATA OUTPUT SIGNAL TO A CLOCK INPUT

PROSECUTION HISTORY

This application is a CIP of U.S. patent application Ser. No. 11/308,518 (Mar. 31, 2006) for a "High Frequency Digital Oscillator-on-Demand with Synchronization", and also claims priority based on Provisional Patent 60/797,172 (May 4, 2006), for "Synchronization of a data output signal to an input of a device; of an input clock to an output clock applied to a distant device on a printed circuit board without use of DLL or PLL analog techniques"; Provisional Patent 60/666,603 filed on Mar. 31, 2005, for "High Speed Digital Oscillator-on-Demand with Synchronization", and also Provisional Patent 60/670,618 (Apr. 13, 2005), for "I/O Output to Clock Edge Synchronization".

FIELD OF THE INVENTION

This invention relates to the field of semiconductor memories such as SDRAM or SRAM or GSDRAM and other devices that have a need to synchronize and phase align data and other output signals to the phase of an applied input clock. This is commonly done for purposes of delivering said signals to another device, such as a controller, in a reliable and predictable manner. Said invention also applies to other semiconductor devices such as CPU's and Controllers that have a need to exchange data and other signals between them and other devices in synchronized manner to an applied clock input.

This invention also applies to delivering to distant devices clock signals equal in frequency to the applied input clock and phase aligned to same. Such clock signals are known as zero delay clock signals.

DESCRIPTION RELATIVE TO THE PRIOR ART

In many applications where an output signal from a silicon chip has to maintain a certain relation to the phase of an applied clock, a synchronization mechanism is required. In prior art, such as SDRAM devises, a data bit output named DQ has to be valid within a range of times before and or after the rising edge of the clock is applied to the SDRAM device. Such times are defined in the specification time tables of the device as tAC (tACCESS) time from clock.

Many designs have been implemented in today's SDRAM, SRAM and GSDRAM devices to accomplish the tAC timings. One such device is known as Delay Locked Loop (DLL). U.S. Pat. No. 5,796,673 by Richard C. Foss et al. describes such DLL methods. In all of the designs known, a clock is applied to the device and delay means, such as Delay Locked Loop, are used to phase shift its rising edge. Then comparator circuits are used to align the phases of both signals, that is, the clock input and delayed clock, so that the output of the data bit signal will be available at the output pin at a predefined time when clocked by this delayed clock signal.

Other synchronization methods used, besides DLL, include the Phase Locked Loop (PLL) method. Such methods use some form of analogue circuitry for comparison of phases and resolution of the delay to be adjusted and applied to the clock path. As such take a lot of cycles to synchronize. The delayed synchronization which results makes such methods undesirable. This is especially true where it required to conserve power without loss of time for synchronization.

Any analogue type of synchronization uses excessive power, and requires many cycles to re-synchronize to the applied clock. Furthermore, in some cases it is not desirable to mix digital with analog circuits in the same manufacturing process.

The PLL technique is mainly used to duplicate an applied input clock and to then distribute single or multiple output copies to distant devices, or to internal circuits of the same device, with phase synchronization at the receiving device. Such devices are known as zero clock buffer devices. Typical applications include a memory module apparatus where multiple SDRAM devices are attached on a printed circuit board, wherein all require to have input clock signals phase synchronized and aligned to a system clock. To accomplish this, a separate silicon device is designed to accept an input clock and to generate multiple output copies to be distributed to the SDRAM devices.

The generation of said signals and the propagation to the distant devices produces a considerable phase shift. To eliminate this phase shift within practical and acceptable measures, the PLL utilizes a feedback loop that is adjusted to duplicate the delay path. The input signal is loaded from the output of the PLL driver to the SDRAM devices and compares the phase of this feedback loop to the clock applied to the PLL device. The phases of the applied clock and of the feedback clock are compared and converted to a voltage, which controls the frequency of a Voltage Controlled Oscillator (VCO). The VCO advances or retards the output clocks so that the clocks driving the SDRAM devices are in phase with the clock signal applied to the PLL input.

The current invention performs many of the operations of prior art analog inventions. However, it does so by use of purely digital methods and circuits, and provides the added benefits of low power, as well as the ability to start and stop on command, without loss of time and synchronization.

SUMMARY OF THE INVENTION

It is an object of the present invention to provide a method for phase synchronizing an output signal with an input clock signal. It is a further object of performing the synchronization within the context of on-demand oscillator synchronization.

In accordance with a first aspect of the invention an output signal of a device is synchronized so as to be phase aligned with an input clock signal applied to same device.

In accordance with a second aspect of the invention an oscillator signal is provided having a period $\Pi n$ of $1/(f1*2^n)$, wherein n is an integer, wherein f1 is the clock frequency, and wherein the oscillator signal is phase aligned with the input clock signal.

In accordance with a third aspect of the invention a multiplicity of delayed signals sdk are generated, where k is an integer, with each delayed signal having the same period $\Pi c$ as the input clock signal, and wherein delayed signal sd1 is delayed by one-half the oscillator period $\Pi n$ from the input clock signal.

In accordance with a fourth aspect of the invention a multiplicity of delayed signals sd(k+1) are delayed by one-half the oscillator period $\Pi n$ from delayed signal sdk for each value of k.

In accordance with a fifth aspect of the invention the phase difference $\Delta\Phi k$ between an unadjusted output signal and delayed signal sdk is measured for each value of k.

In accordance with a sixth aspect of the invention the value of k, equal to km, resulted in the smallest positive value of $\Delta\Phi k$ measured, is determined.

In accordance with a seventh aspect of the invention a coarse delay time $\Delta\tau 1$ is added to the clock signal, creating a delayed clock signal, wherein $\Delta\tau 1$ is equivalent to the smallest positive value of $\Delta\Phi k$ measured.

In accordance with an eighth aspect of the invention a new output signal is generated by use of the delayed clock signal, the new output signal being delayed by time $\Delta\tau 1$ from the output signal.

In accordance with a ninth aspect of the invention the phase alignment of the oscillator signal with the input clock signal is effected by aligning a rising edge of the oscillator signal with a rising edge of the input clock signal.

In accordance with a tenth aspect of the invention generating the output signal is accomplished by gating circuits.

In accordance with an eleventh aspect of the invention a fine delay time is generated by the steps which include determining the phase difference $\Delta\Phi k2$ between the new output signal and the delayed signal sdk corresponding to k=km.

In accordance with a twelfth aspect of the invention a fine time delay $\Delta\tau 2$, equivalent to phase difference $\Delta\Phi k2$, is generated.

In accordance with a thirteenth aspect of the invention a delay of $\Delta\tau 2$ is added to the delayed clock signal.

In accordance with a fourteenth aspect of the invention the generating of the fine delay time further is accomplished by passing the output signal through a delay tree.

In accordance with a fifteenth aspect of the invention generating the fine delay time is accomplished by selecting the branches of the delay tree which produces the delay closest in magnitude to $\Delta\tau 2$.

In accordance with a sixteenth aspect of the invention the delay tree includes a multiplicity of gates of preselected delay characteristics, and with a multiplicity of selection taps.

BRIEF DESCRIPTION OF THE DRAWINGS

These, and further features of the invention, may be better understood with reference to the accompanying specification and drawings depicting the preferred embodiment, in which.

DESCRIPTION OF THE PREFERRED EMBODIMENTS

Figure 1:
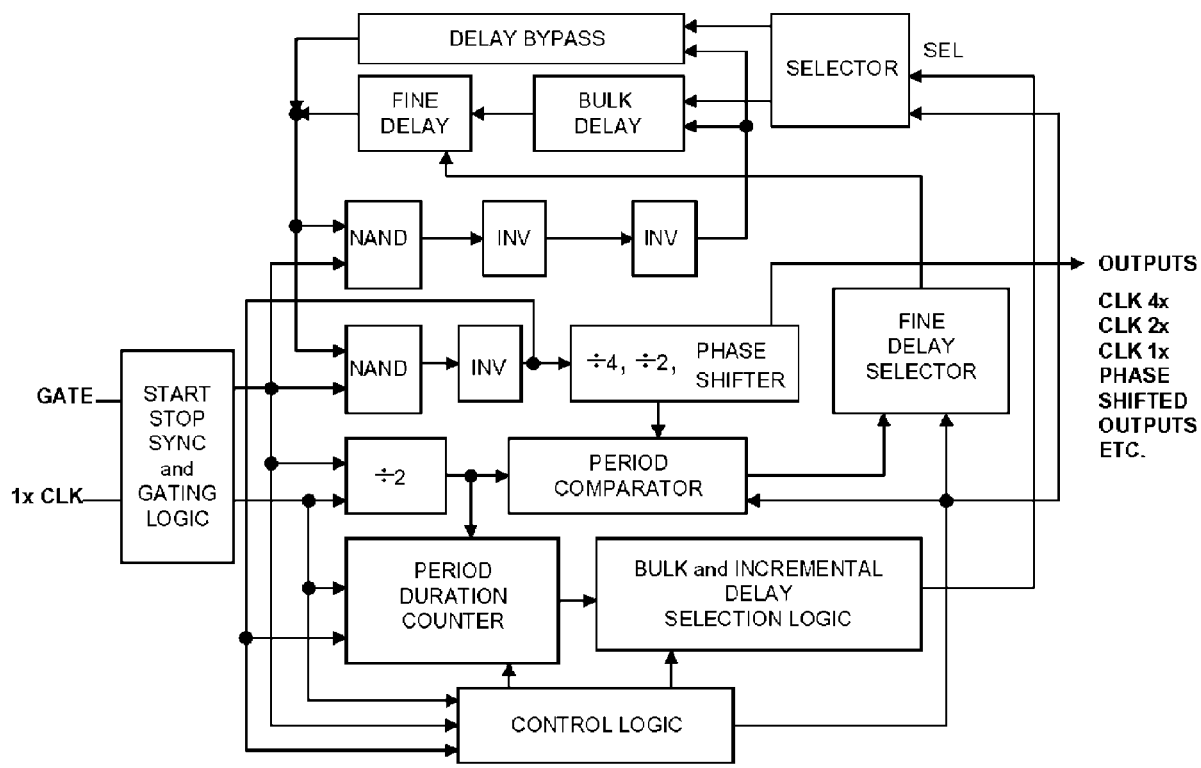
FIG. 1 depicts a block diagram of the digital ring oscillator and associated controls.

An "Oscillator-on-Demand" is, by definition, an oscillator which does not oscillate until it is gated to start. The detailed description of the invention defines how the oscillator is constructed and how it will operate on demand along with a method of synchronization with an external clock source.

This invention relates to methods and to the apparatus in which a gated ring oscillator is constructed in silicon and controlled to provide a base clock frequency multiple times higher than the frequency of an applied clock signal. The multiplication factor in this device is a power of 2 times that of the clock signal.

Such a ring oscillator has the ability to be turned On and Off without generating a time delay before synchronization to the control signal is effected.

This circuit has the ability to provide multiple clock frequencies derived from the base ring frequency and to further provide a plurality of multiply phase shifted clocks, while maintaining a synchronized relationship to the incoming control clock.

The ring oscillator frequency is adjustable to cover a range of frequencies based on the frequency of the controlling clock. The ring oscillator reproduces the period of the controlling incoming clock and maintains a good synchronization therewith. It uses neither the customary Voltage Control Oscillator nor the Delay Locked Loop methods.

The designed base frequency is altered by circuit delays, based on the inherent delays of the silicon hardware, providing an adjustment to the required clock frequency. It uses methods of measuring the duration of signals and translates those to circuit delays for frequency adjustment.

Signal variations resulting from variations in the silicon circuitry, voltage and temperature are better controlled and compensated using the present invention that in any of the prior art circuits.

Once the final delays have been selected and the final frequency is established, those values are preserved as long as power continues to be applied to the circuits. They may also be saved in a Flash type device to be re-applied whenever the power is reapplied.

After the delays are selected and the frequency is adjusted, the rising edge of the controlling incoming clock will produce the first rising edge of the ring oscillator, thus maintaining good synchronization with the input clock signal.

During the initial power-on time, the amount of the delay and selection of the delay to adjust the ring frequency will require two to three incoming clock periods.

During initial power-up time of a system, many initialization processes must be completed before any useful work can take place. Therefore, there is no time lost by frequency adjustment of the ring.

All of the circuits for the oscillator of the present invention are digital in nature. In comparison, analog circuits consume much higher levels of power. As a result, the present invention provides an appreciable saving in power consumption than the circuits of the prior art.

Detailed Description of the On-Demand Oscillator

A digital approach not requiring either a Voltage-Controlled Oscillator or a Delay-Locked Loop will be described herein.

Figure 1A:
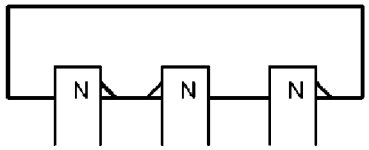
FIG. 1a depicts an arrangement of digital circuits that comprise a basic free running ring oscillator.

As is well know in the prior art, if an odd number of digital inverter circuits are connected in a loop arrangement, the loop will oscillate as long as there is power to the circuits. Such an arrangement is known as a ring oscillator and is shown in FIG. 1a. The oscillator pulses produced by the ring oscillator will be very symmetrical. The frequency produced will depend on the total delay of the inverter circuits and the delay that may be applied at any point in the loop as a series delay 101 or as a load delay 102 as shown in FIG. 1b.

The latest developments in silicon technology have produced very small gate delays. It is not unusual to have inverter circuits in the very small pico-second range, typically 20 to 50 picoseconds. Thus, the ring oscillator of FIG. 1a runs at very high frequency. But it and has no facility to start or stop oscillation other than applying and removing power to the digital inverters. In addition, if a load or a delay is applied at any point in the loop, the oscillator frequency will decrease depending on the amount of delay caused by the cumulative loading. These two drawbacks are remedied by the present invention.

Figure 1B:
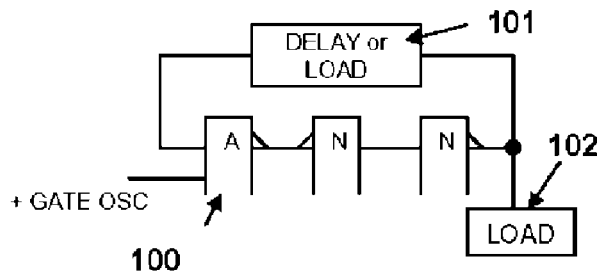
FIG. 1b depicts an arrangement of digital circuits that comprise a gated ring oscillator that includes a delay block inserted in the loop.

A variation of the ring oscillator with a gating signal is shown in FIG. 1b. One of the inverters is substituted by a NAND gate 100. One of the NAND inputs is attached to the loop and the other to a gating signal called GATE OSC. The loop delay is also controlled with the insertion in series of a fixed or adjustable delay element 101 or an attachment of a capacitive load 102 in the loop. If the GATE OSC signal is at Lo level, the loop will stop oscillating. If the gating signal is at Hi level, the loop will oscillate as long as there is power attached to the circuits.

Figure 1C:
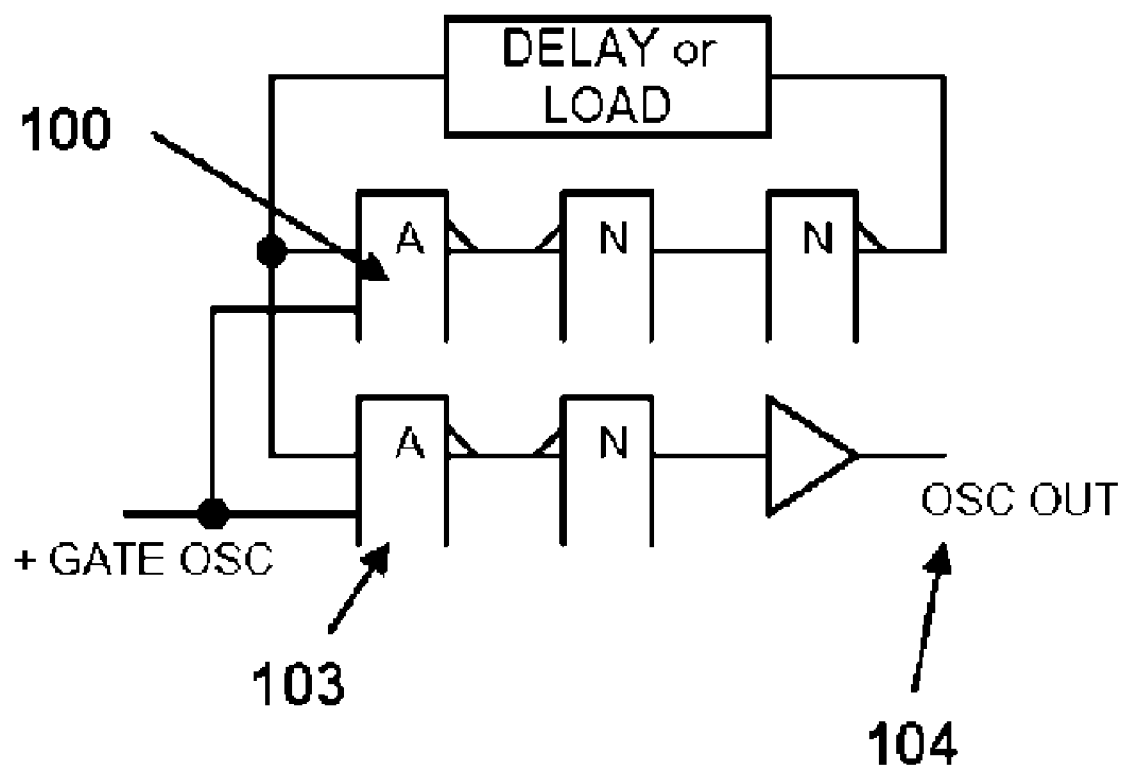
FIG. 1c depicts a gated ring oscillator with the delay inserted in the loop and with a gated oscillator output.

To avoid the loading effects to the loop, the output of the oscillator OSC OUT 104, shown in FIG. 1c, is derived by a separate NAND gate 103 attached to the same gating signal that gates the ring loop. The addition of the load to the loop by the added NAND gate 103 will slow the oscillator slightly. The phase of the signal OSC OUT 104 is selected by the logic gates that produce it.

If a 50 pico-second delay per gate is assumed in the loop FIG. 1a, the pulse width will be 150 picoseconds and the ring frequency f will be 1/300 picoseconds or 3.333 GHz. This is the highest frequency at which this loop can oscillate.

The GATE OSC signal FIG. 1c is used to turn the oscillator on and off. If the signal is Lo level, will stop the ring from oscillating. When it goes Hi, it will produce the OSC OUT signal with the first rising edge of the pulse in synchronized phase with the GATE OSC signal and within some delay. The phase delay of OSC OUT will be the delay of the gates, the driver delay and the delay caused by the load attached to it. As long as the GATE OSC signal stays Hi, the ring will continue to oscillate and will generate the OSC OUT frequency equal to the ring frequency. The ring frequency is adjusted by varying the loop delay.

Figure 2:
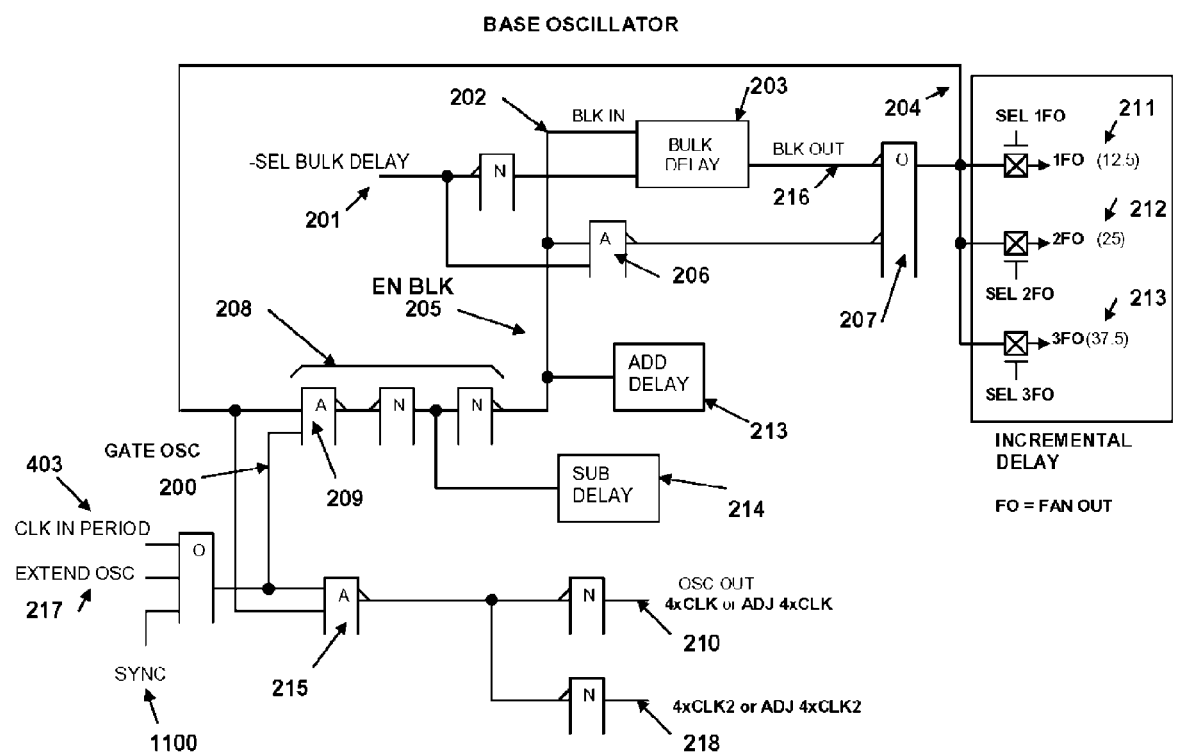
FIG. 2 depicts a more detailed drawing of the gated ring oscillator with delays and controls to implement them.

To further understand the operation of this circuit, reference is made to FIG. 2, the BASE OSCILLATOR. Referring now to this Figure, the oscillator is seen to include the base ring gates 208 with a gating signal 200. The base ring is constructed with the ability to add or subtract a delay time. The feedback loop consists of two paths. The first is through gate 206, through OR gate 207, connected by feedback 204 to the input of the NAND gate 209 of the ring. The other path is through the BULK DELAY 203, through OR gate 207, connected by feedback 204 to the input of the NAND gates 209 and 215. Selection of path 206 or 203 is accomplished by signal 201-SEL BULK DELAY.

To further explain the operation, the following example is described. Assume that the BULK delay 203 is bypassed and path 206 is selected. For this example, the Ring Oscillator 208 and the initial selected path along with the attached delays ADJ DELAY1 and ADJ DELAY2 and other loads is chosen to have a total loop delay of 300 picoseconds. The period of the oscillator, in this case, will be 600 picoseconds and the frequency of the ring will be 1/600 picoseconds or f=1.666 GHz. The signal, OSC OUT 210, will have the same frequency as the ring oscillator. Gate 215 taps off gate 209 inputs to reduce the loading effects to the ring.

The Hi level signal of the GATE OSC 200 allows the ring to oscillate. The GATE OSC 200 can be produced by any of the signals 403, 217 or 1100. These signal durations determines how long the oscillator will oscillate. To derive lower frequencies, the ring frequency is further divided digitally to obtain the desired clock frequencies and desirable phase shifts.

Figure 8:
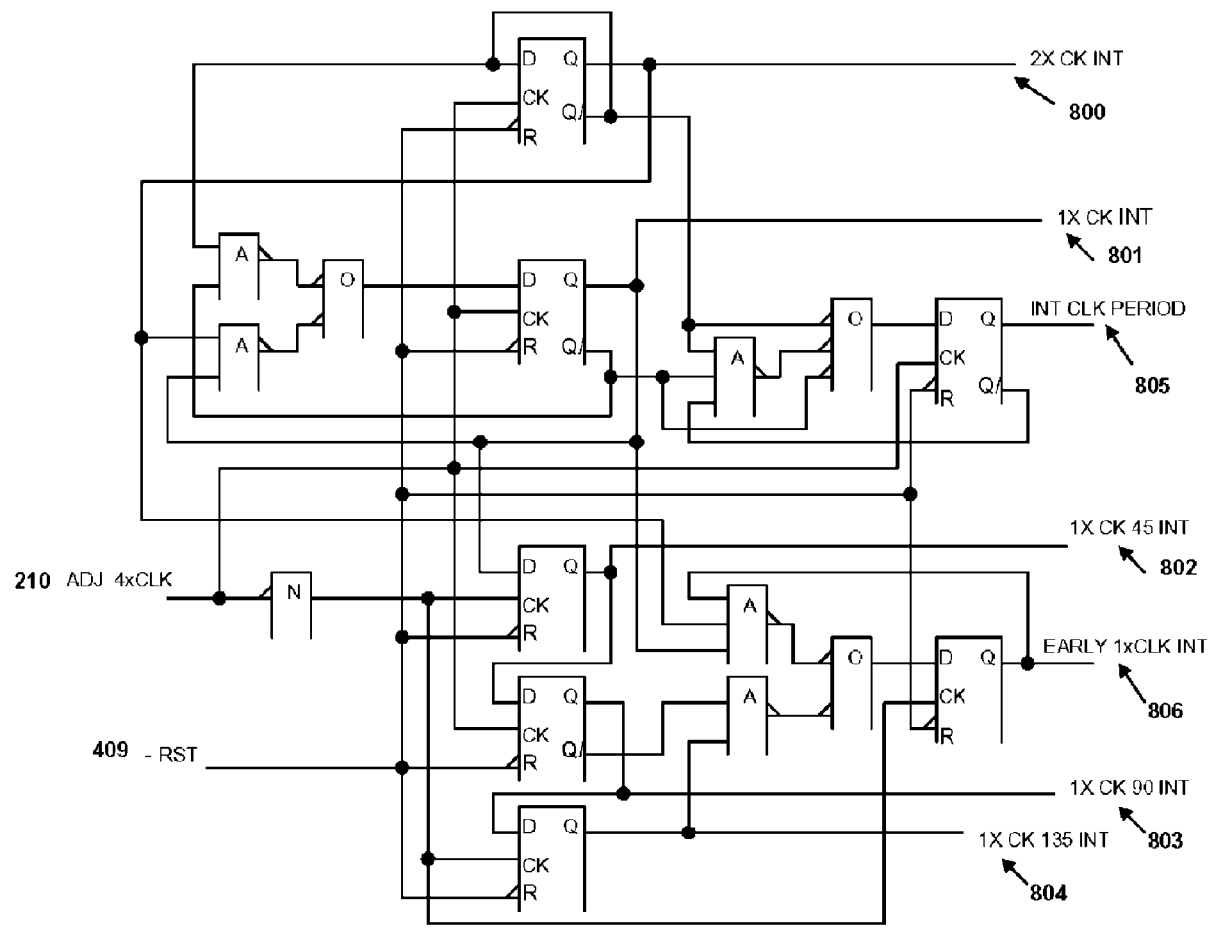
FIG. 8 depicts a base ring oscillator frequency divider and phase shifter circuit.
Figure 8A:
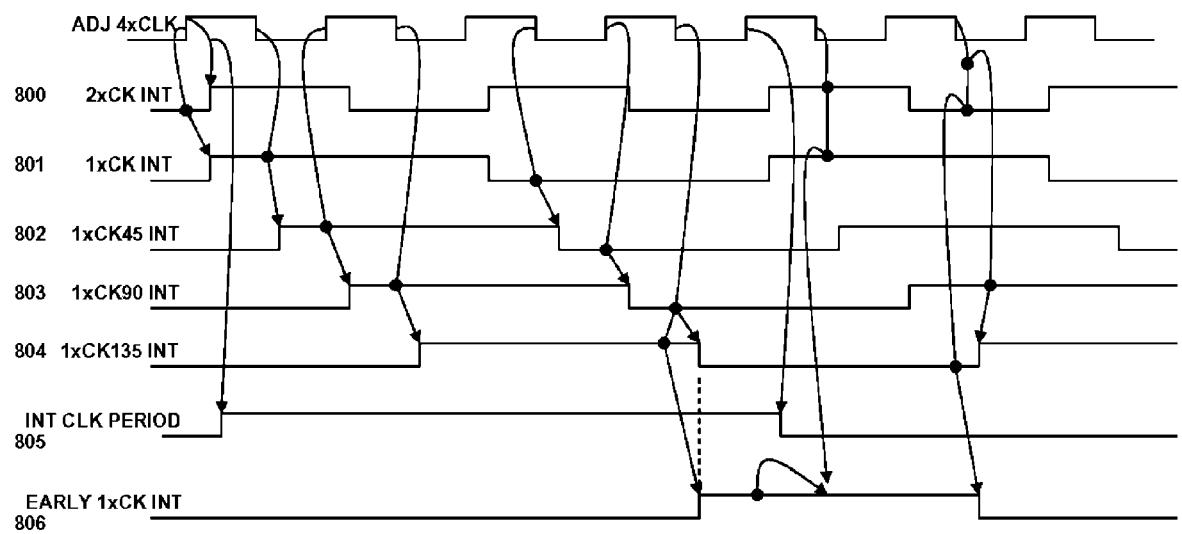
FIG. 8a depicts a timing diagram of the derived signals from the design of FIG. 8.

Referring now to FIG. 8. A divider and phase shifter circuit is shown. The timing diagram of signals of this circuit is shown in FIG. 8a. It is assumed that the base frequency of the oscillator is ADJ 4×CLK 210 after the delay adjustment of the loop has taken place.

To be able to select any oscillator frequency within a range of frequencies established by the intended design, a BULK delay selection mechanism in path 203 is required along with selection of incremental delays. The BULK and incremental loop delays are partitioned in selectable increments to adjust the ring oscillator frequency.

Figure 3:
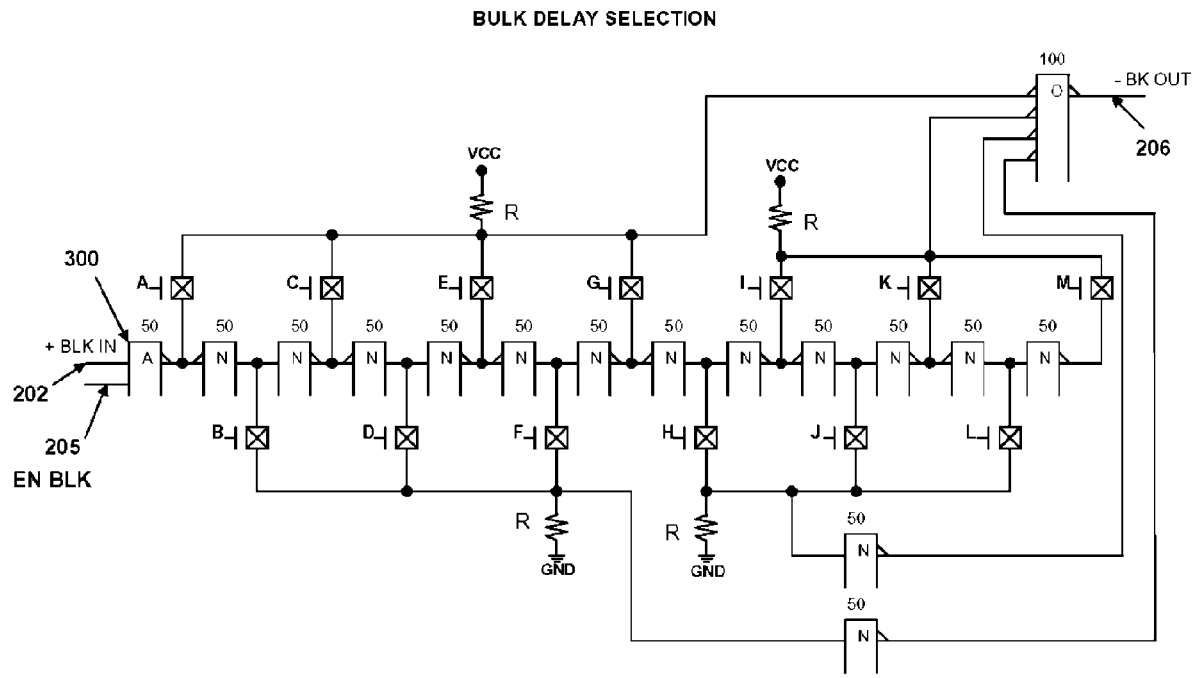
FIG. 3 depicts a BULK delay tree with selection taps and controls to enable them.

Referring next to FIG. 3, the bulk delay arrangement is shown, consisting of a series of selectable inverters. Selection can be made by any digital means without departing from the main aspect of the invention. A typical delay through each inverter will be assumed to be 50 pico-seconds. The output of each inverter stage will be selected by a PASS GATE, or similar means, and inserted in the loop through the OR gate. The entire bulk delay arrangement can be bypassed, and the delay eliminated, by disabling the NAND gate 300 of FIG. 3.

Initially the BULK delay 203 will be bypassed. Only the base loop 206 will be selected. As a typical implementation, the base loop period is 600 pico-seconds with a pulse width of 300 picoseconds. The maximum frequency of the base loop will be 1/600=1.666 GHz. The base loop frequency is designed, initially, at a value appropriate to measure the period the width of an incoming clock period.

Once the measurement is accomplished, the BULK delay 203 and or any of the adjustable delays, ADD DELAY 213 or SUB DELAY 214 is selected and inserted in the loop. At this point the frequency of the oscillator will be close to the desired base oscillator frequency from which all other required frequencies are derived. Further fine adjustments to this frequency will be made for more accuracy and synchronization.

It is desirable to have the base oscillator frequency be powers of 2 times the input frequency, or n×CLK IN frequency where (n=1 2 4 8 ...). The highest frequency is chosen at design time. For the purpose of illustration, n=4 is chosen.

The base loop frequency, once selected and adjusted with the loop delay, will be divided by 4 to produce a frequency as close as possible to the incoming CLK IN frequency or 1CLK 400. This is effected by a coarse adjustment of the ring oscillator. A fine adjustment of the ring oscillator is also provided.

Referring again to FIG. 2. the GATE OSC 200 signal starts the oscillator. The signal GATE OSC 200 is produced according to design requirements. A pulse of the GATE OSC 200 is selected to be the positive pulse of the incoming period CLK IN PERIOD 403. It is this positive pulse whose width duration is to be measured and determine what delay to use in the loop so that a division by 4 will give a clock period as close to the duration of the incoming CLK IN PERIOD 403. Measuring the period duration rather than the half period of the incoming clock is a more accurate way because it does not depend on duty cycle pulses of the period.

Method of Measuring Pulse Width Duration

Figure 5:
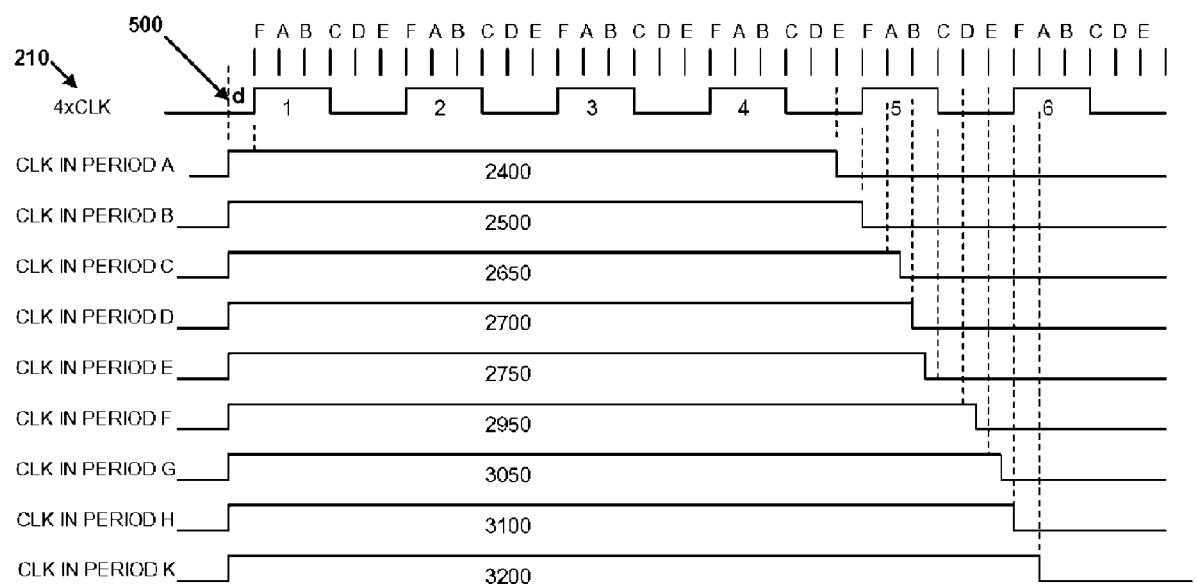
FIG. 5 depicts a timing diagram which shows the relationships of different clock frequencies with respect to the oscillator basic frequency.

To measure the duration of the pulse width of input frequency f1, the present system counts how many base oscillator (also called the "ring oscillator" periods and fractions of the period one can fit in the duration of one period of the incoming clock. Samples of typical signals are shown in FIG. 5.

The output signals are subject to a coarse frequency adjustment. That will be a coarse frequency adjustment. For the illustration we chose to have a range of incoming clock frequencies from 400 MHz and below. These frequencies will be referred to as 1×CLK frequencies. They are intended to be one quarter of the ring oscillator frequency once the loop delays are adjusted. The interest here is to have a 1×CLK internally derived frequency from division of the base oscillator in synchronization and as close as possible with the 1×CLK incoming clock. The base ring oscillator frequency with the loop delay adjusted will be referred to as the ADJ 4×CLK. A division by 4 will produce the internal 1×CLK. The period of the derived 1×CLK internal and the period of the incoming 1×CLK external will be further compared and the result will be used to adjust a fine loop delay.

Incoming Clock Period Duration Measurement

For this example the loop oscillator is designed to produce an output signal with a period of 600 picoseconds. In practice any frequency can be chosen as long as the silicon speed can support it and as long as latches and counters can be operated reliably at this output frequency. The oscillator pulse must be wide enough to clock a latch reliably. The initial base loop delay will have adjustable delay components to increase or decrease the base loop frequency before any BULK delay is applied to the loop. Circuitry is provided to control the base oscillator output frequency by inserting delays in the path of the feedback loop.

The following description includes:

means to measure duration of one of the incoming clock periods;

means to select the applicable BULK loop delay;

means to adjust the delay for the incremental duration non-accounted with the BULK loop delay;

means to refine the delay to get as close as possible to the incoming clock frequency; and means to synchronize the oscillator with every rising edge of the incoming clock period.

For the purposes of further explaining the operation of the present invention, assume the base non-adjusted ring oscillator runs 4 times as fast as the incoming clock. The circuitry first determines how many base clock periods of the unadjusted 4×CLK 210 one can fit in the CLK IN PERIOD 403 of the external 1×CLK 400. A 4 bit counter is implemented to be able to cover the frequency range chosen. If the base clock period is shorter than 600 picoseconds a counter larger that 4 bits may be required.

Measurement of the incoming clock periods.

Figure 4:
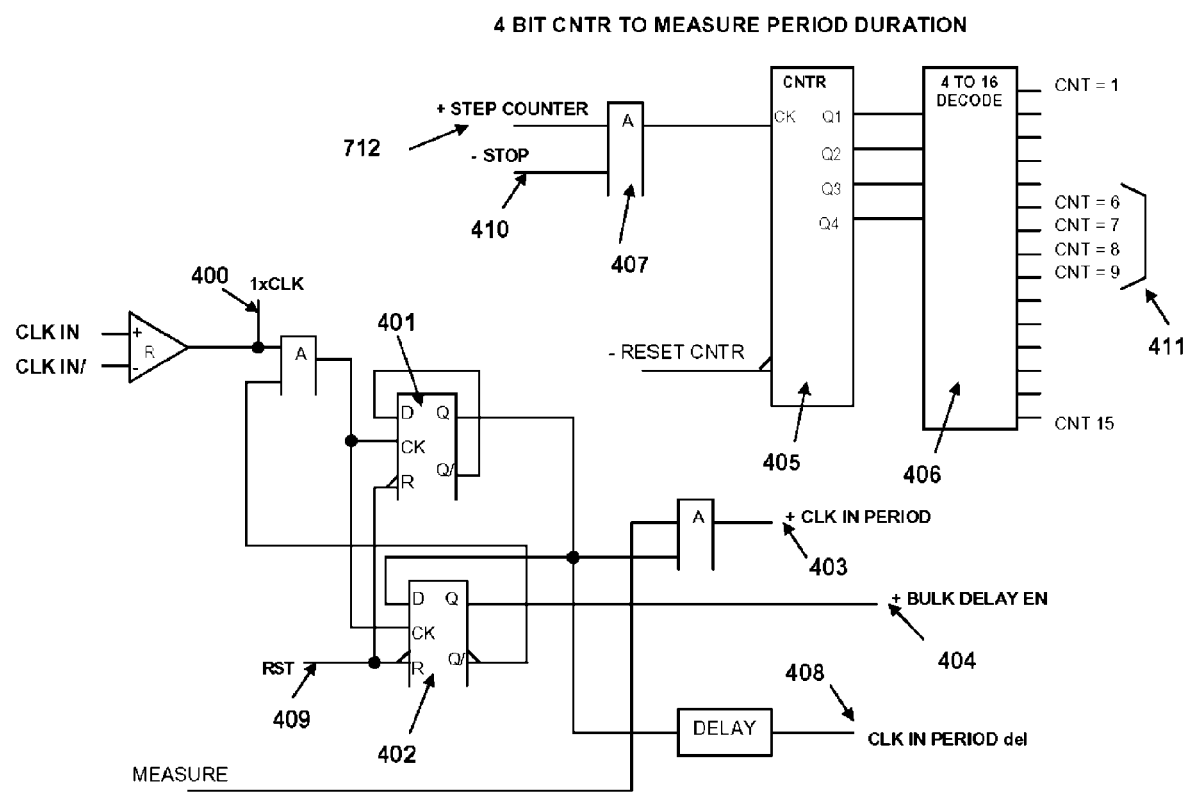
FIG. 4 depicts a digital design approach to generate an incoming clock period and a 4 bit counter to facilitate in determining the incoming clock period.
Figure 7:
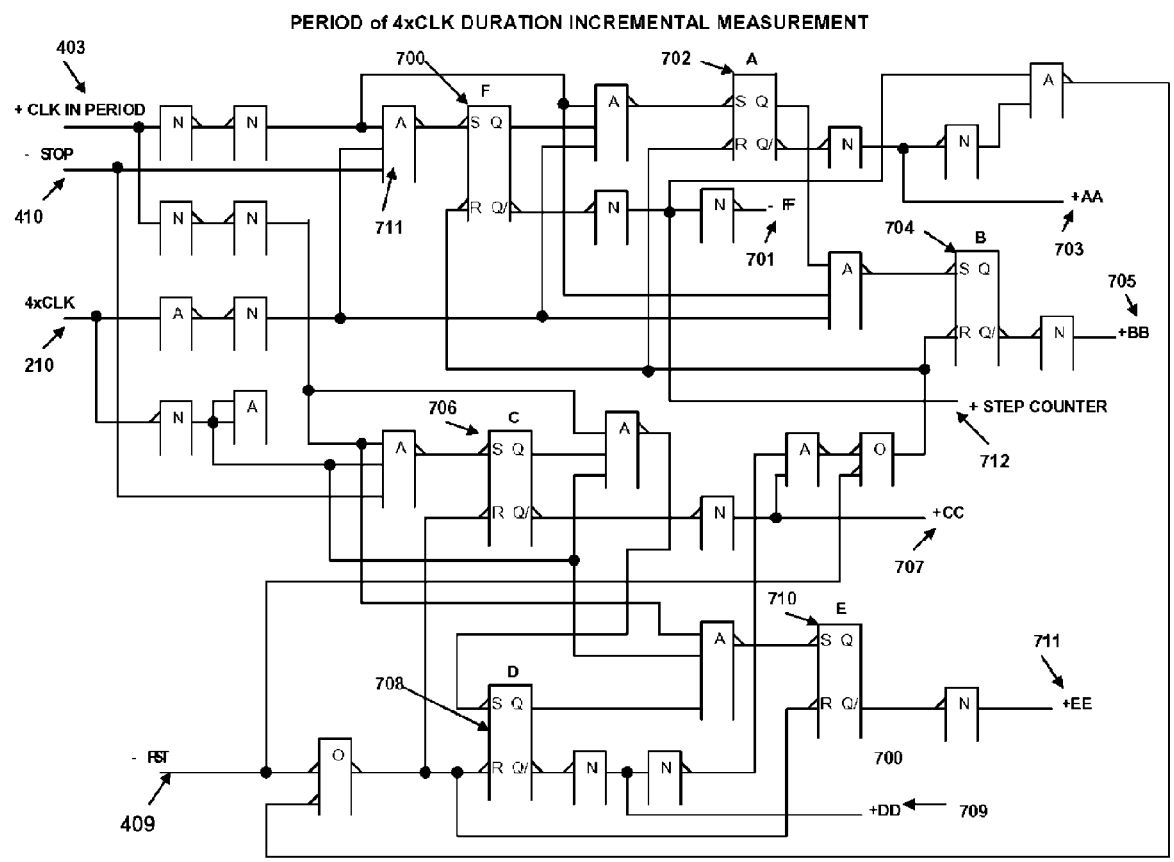
FIG. 7 depicts a collection of Set/Rest latches used to measure the duration of the base ring clock signal within the duration of one period of the incoming clock.

Referring now to FIG. 4, the period counter 405 is stepped with the rising edge of the STEP COUNTER signal 712 of FIG. 7. The STEP COUNTER signal is produced only if latch F 700 of FIG. 7 is set. This occurs always after every rising edge of the 4×CLK. The counter will count as long as the CLK IN PERIOD 403 is Hi and latch F 700 gets set. Latch F 700 will set if the AND 711 condition of the CLK IN PERIOD and the 4×CLK Hi pulse is wide enough to satisfy the set time of the latch. It will reset every time latch C 706 sets.

Figure 4A:
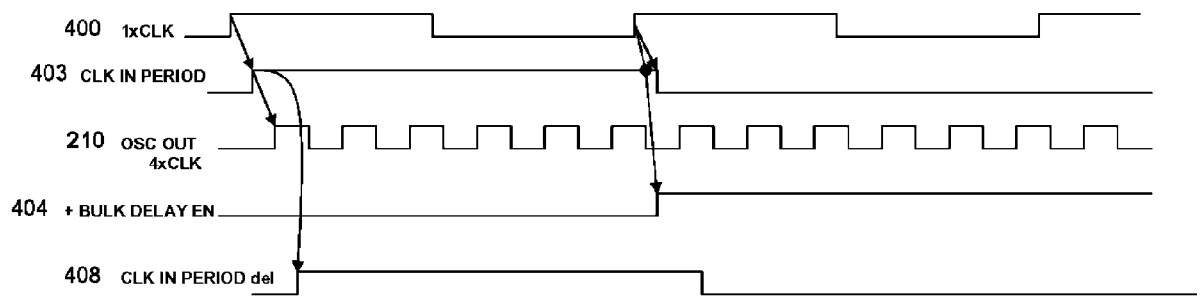
FIG. 4a depicts a timing diagram derived from the logic of FIG. 4, which shows the relationships between various signals.

Referring next to FIG. 4, after the RST expires, latches 401 402 and period counter 405 are set to the idle or reset state. The incoming 1×CLK 400 drives the divider latch 401 and the enable latch 402. The divider latch 401 produces the desired period pulse CLK IN PERIOD 403, which is shown in FIG. 4a. Latch 402, when set, allows selection process of the BULK delay. Other circuits may be employed to determine when and how the BULK delay is selected without departing from the current invention.

Latch 402 is reset with the RST signal 409. However, other methods for reset could be used to allow period measurements without departing from the current invention. CLK IN PERIOD 403 is fed to FIG. 2 to produce the signal GATE OSC 200 to start the oscillator. The signal GATE OSC 200 has to be extended to allow the completion of the period measurement and other delay selections. Once all of the variable parameters have been chosen, the values will be preserved as long as power is applied.

The first 4×CLK 210 rising edge always occurs after the CLK IN PERIOD 403 rising edge. This interval of time is shown as 500 in FIG. 5 and FIG. 6 and is assumed to be 100 picoseconds for the purpose of illustration. Other values could be used according to the deign implementation. The output of the period counter is decoded by a 4 to 16 decoder 406. The decoded count is part of the selector mechanism of the BULK delay value. Selection of the BULK delay is allowed only after CLK IN PERIOD 403 expires and proper logic decision time is established.

When pulse CLK IN PERIOD 403 terminates, the counter will stop from counting because there will be no further setting and resetting of latch F 700 of FIG. 7.

Referring now to FIG. 5. The base clock period of the unadjusted 4×CLK 210 is sub-divided into equal intervals. The rising edge of each period is designated by the letter F. The interval F is from the rising edge of the clock to the beginning of the interval designated with the letter A. The interval of time selected for the purposes of illustration was chosen to be 100 picoseconds. Therefore 6 intervals are produced since the chosen frequency of the base non-adjusted oscillator period is 600 picoseconds. The interval named F, A through E for every period of the 4×CLK is shown in FIG. 5 and in FIG. 6. The interval of 100 picoseconds is chosen so that an SR (Set Reset) latch can be reliably set. Representative SR latches 601 and 602 are shown in FIG. 6.

Figure 6:
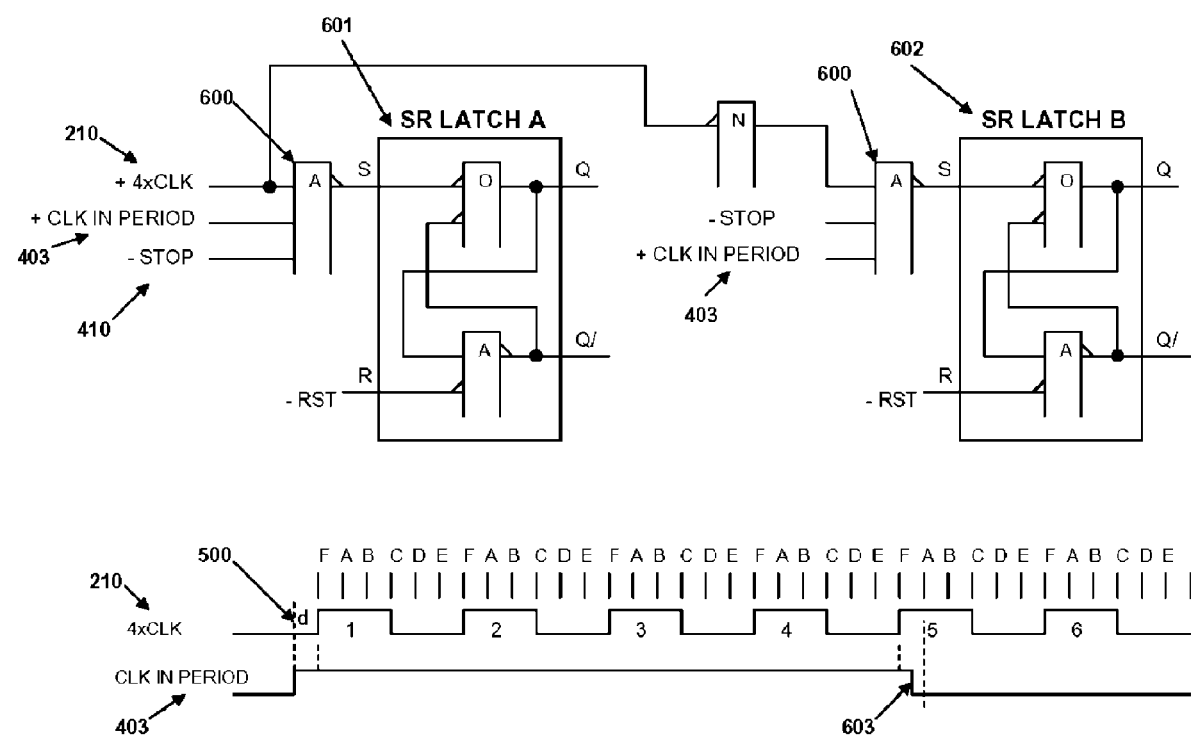
FIG. 6 depicts a pair of Set/Reset latches, showing the relationship between the input signal to the latches and the ring frequency signal.

Referring now to FIG. 6, two SR latches 601 and 602 are shown. The setting of the latch is the Lo signal of the output of the NAND gate 600. Assuming that the STOP signal 410 is not active, the setting of the latch is determined by the state of signals 4×CLK 210 and CLK IN PERIOD 403. The timing relationship of these signals is shown in FIG. 6. CLK IN PERIOD 403 is the signal to be measured. Signal 4×CLK 210 is the base clock which appears in FIG. 2 before any BULK and incremental delays have been selected and applied. In this case, the period of the 4×CLK is assumed to be 600 picoseconds by design. Latch 601 is set only with the Hi pulse of the 4×CLK period, while latch 602 is set during the Lo pulse of the 4×CLK period.

Three latches are required for the Hi pulse and three for the Lo pulse of the 4×CLK. Those latches are shown in FIG. 7 and are named F 700, A 702 and B 704 for the Hi pulse and C 706, D 708 and E 710 for the Lo pulse. Whenever latch F 700 is set, a reset signal is applied to the latches C, D and E. The reset is removed when the A latch is set. Whenever latch C is set, a reset signal is applied to the latches F, A and B. The reset is removed when the D latch is set.

With every period of the 4×CLK under the valid Hi time of the CLK IN PERIOD, all latches of FIG. 7 are set and reset accordingly. Eventually, the trailing edge 603 of the CLK IN PERIOD signal will occur within some point of the period of the 4×CLK. Only some latches will stay set when that happens. The last latch to set will be determined by the time overlap of the 4×CLK Hi or Lo pulse and the end of the CLK IN PERIOD signal. At this point, a STOP signal 410 could be applied to inhibit further latch alterations. When the stopped stage is reached, a decoding of the period counter 405 and of the incremental latches of FIG. 7 will take place and the total BULK and incremental delay value will be selected from the delay string of FIG. 3 and FIG. 2 accordingly and will be inserted in the loop of the gated oscillator.

There is a required time from the input to the NAND gate 600 until the latch 601 or 602 is set. This time is determined by the speed of the CMOS process technology used for the implementation of the logic. For the purposes of illustration, it is assumed 100 picoseconds nominal pulse width is required to set the latch reliably. This means that if, for example, the CLK IN PERIOD trailing edge occurs 100 or more and less than 200 picoseconds past the rising edge F of the 4×CLK, only latch F 700 of FIG. 7 will be set. Therefore, the CLK IN PERIOD could extend 0 to 99 picoseconds past the 100 picoseconds required duration to set latch F 700 without affecting the next latch. The same applies for all other latches of FIG. 7.

The incremental latches as shown in FIG. 7 will be set and reset during each 4×CLK 210 period provided that the period is overlapped by the CLK IN PERIOD 403. When the period ends, the latches that remain set will be frozen in that state and will be decoded.

Based on the period counter decoded value by decoder 406 and based on which latch was the last to be set, the appropriate BULK and incremental delay from the delay trees will be selected to be added to the loop.

Once the BULK and the incremental delays are set, they will remain set until the decision is made to go through the selection again. In addition to the selected delays as described, there is one more determination to be made about fine delay adjustment. During the incremental latch setting in FIG. 7, the CLK IN PERIOD 403 to be measured may have a range of ending times past the last latch to be set. This time is between 0 and 99 picoseconds for the illustration numbers chosen for clock period and incremental intervals.

Referring next to FIG. 6, the CLK IN PERIOD 403 shown in the timing diagram starts 100 picoseconds before the rising edge of the first 4×CLK 210 pulse. It ends past period #5 but does not satisfy the time required to set the latch F 700 of the next period.

Referring again to FIG. 5, several CLK IN PERIOD signals with their trailing edge are shown. Assuming a CLK IN PERIOD of 3100 picoseconds, and assuming that the base unadjusted ring oscillator has a period of 600 picoseconds, the period counter at the end of the period duration will have a count of 5 and the incremental latch E 710 of FIG. 7 set. Latch E 710 represents 600+ picoseconds.

For the purpose of illustration, each incremental latch of FIG. 7 has a weight (value) of 100 picoseconds, and the following parameters are also assumed:

Weight of Latch F=100 picoseconds
Weight of Latch A=200 picoseconds
Weight of Latch B=300 picoseconds
Weight of Latch C=400 picoseconds
Weight of Latch D=500 picoseconds
Weight of Latch E=600 picoseconds If the technology used has fast circuits, the partition of the period could be more than 6 portions of smaller weight and with smaller delay selection accordingly.

Bulk Delay Selection

Figure 10:
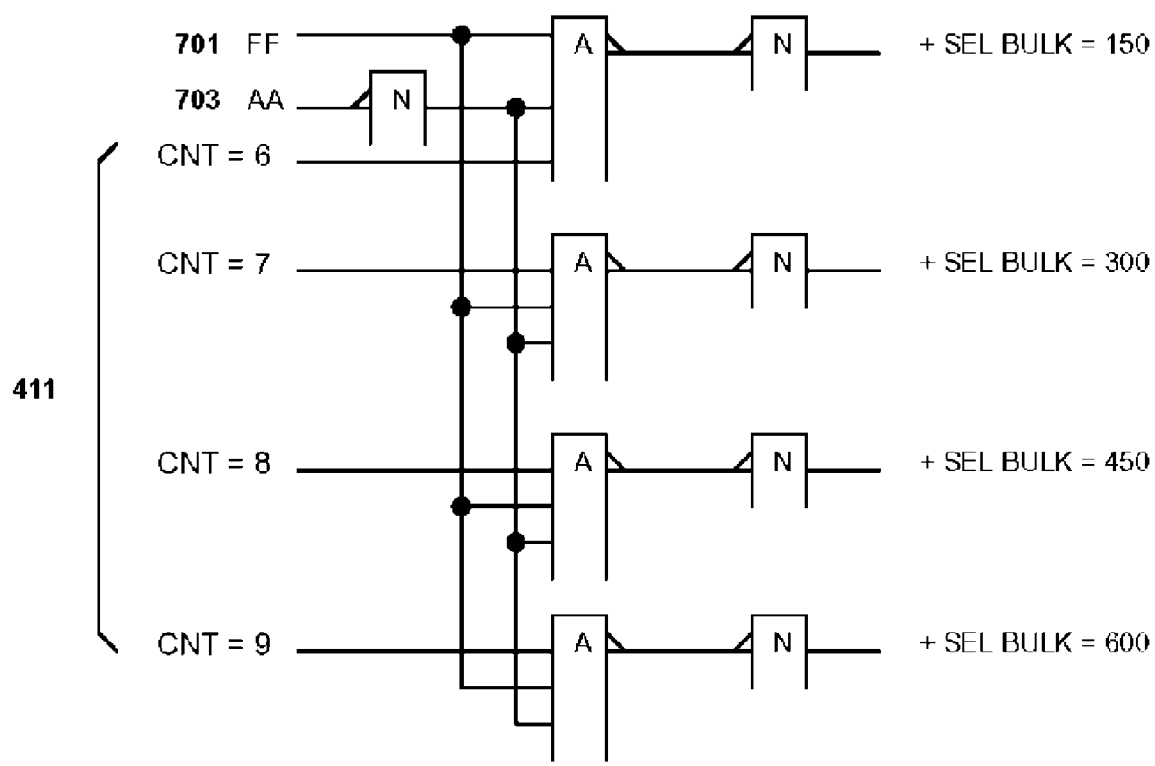
FIG. 10 depicts a decoder having inputs from the decoders of FIG. 4 and the latches of FIG. 7 used to select the proper BULK delay to be inserted into the ring oscillator loop.

For every full period count above 4, a total BULK delay of 150 picoseconds is selected for our example used herein. This number applies to one half period of the base ring clock. It must be multiplied by 2 and then added to the base clock period of 600 picoseconds. The new base clock period will be 600+150=750 picoseconds. Bulk delays of FIG. 3 could be arranged in other values instead of 50 picoseconds sections. A typical selection for BULK delay per full base clock period measured is shown in FIG. 10. The decoded counter value and the incremental latches F and A of FIG. 7 will determine the value of the BULK delay to be inserted into the loop. Any delay inserted into the loop will affect each half period of the base oscillator.

Fine Delay Selection

Once the BULK delay is selected, there is additional incremental delay to be selected based on the decoded incremental latches of FIG. 7 for finer adjustment of the ring oscillator frequency in order to produce the 1×CK INT 801 equal, or close to equal, to the 1×CLK 400 frequency.

Figure 9:
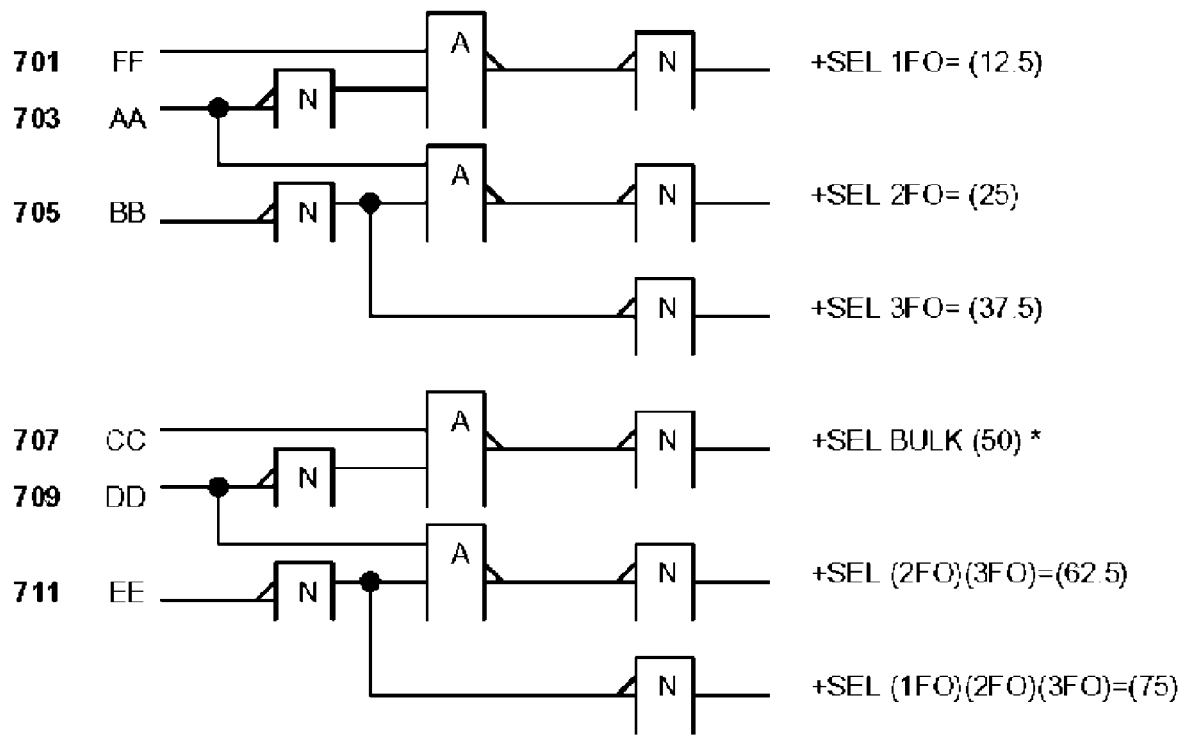
FIG. 9 depicts two digital circuits used to decode the S/R latches set in FIG. 7.

Decoding of the incremental latches and Incremental delay selection is shown in FIG. 9. The incremental delays are shown in 211, 212 and 213 of FIG. 2 as numeric values and as Fan Outs (FO).

After the BULK and the incremental latch delay selection, there is additional delay to be added to the loop. This delay is to account for the initial offset 500, as shown in FIG. 5, which is assumed to be 100 picoseconds, as well as the inaccuracy of the delays in the BULK delay tree of FIG. 3, the inaccuracy due to process, voltage and temperature variations and the inaccuracy of the speed of the incremental latch setting.

After this initial BULK and incremental delay selection, the loop is adjusted to produce the 1×CK INT 801 and INT CLK PERIOD 805. The relationship of these signals and the phase shifted signals derived from the circuit of FIG. 8 are shown in FIG. 8a. Another signal produced is an early 1×CK INT 806 to be used for phase synchronization with the 1×CLK IN of FIG. 4.

Figure 8B:
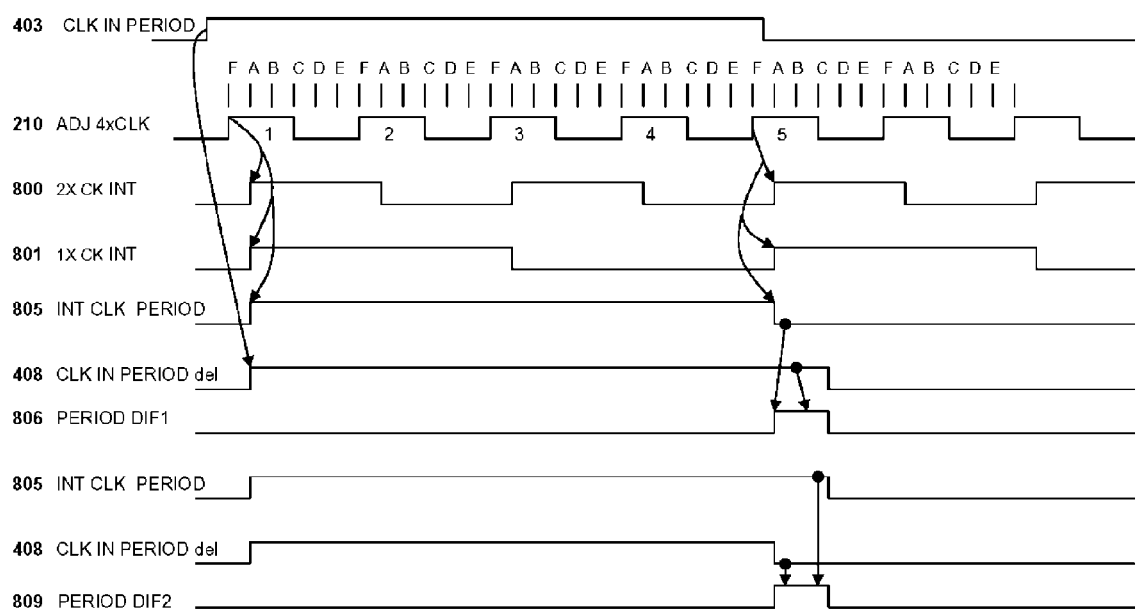
FIG. 8b depicts a timing diagram showing the signal produced by the circuit of FIG. 8, together with signals 408 and 805.

Referring now to FIG. 4, the CLK IN PERIOD 403 signal goes through a delay so that the phase of the CLK IN PERIOD del 408 signal co-insides with the phase of the INT CLK PERIOD 805 signal. This is shown in timing diagram of FIG. 8b.

Figure 8C:
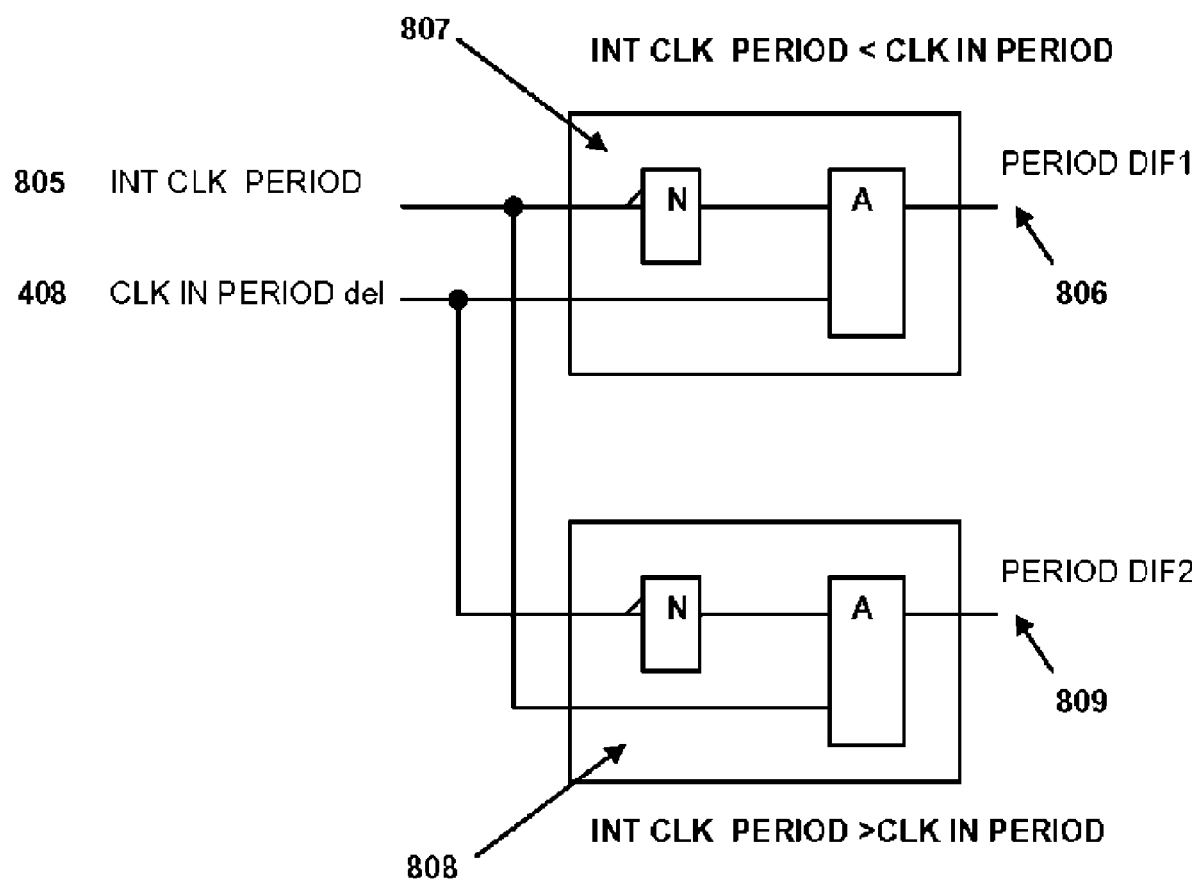
FIG. 8c depicts two digital circuits used for comparison of two signals which produce a pulse for time measurement of the phase difference between the two signals.

Then INT CLK PERIOD 805 and CLK IN PERIOD del 408 are compared in circuits 807 and 808 of FIG. 8c. Each of the circuits 807 and 808 will produce a pulse whose width is the difference in time between the two periods. Then pulse PERIOD DIF1 806 and PERIOD DIF2 809 are applied to fine delay calculation circuits shown in FIG. 8d.

Each latch when set will represent a delay adjustment to be made to the delay of the loop. The weight of each latch will be 100 picoseconds and in loop delay adjustment 12.5 picoseconds. Latch A 811 and latch B 812 of FIG. 8d will add the appropriate delay to the loop to expand the period duration. Latch A 812 and latch B 813 of FIG. 8d will subtract the appropriate delay from the loop to shorten the period duration.

Figure 8D:
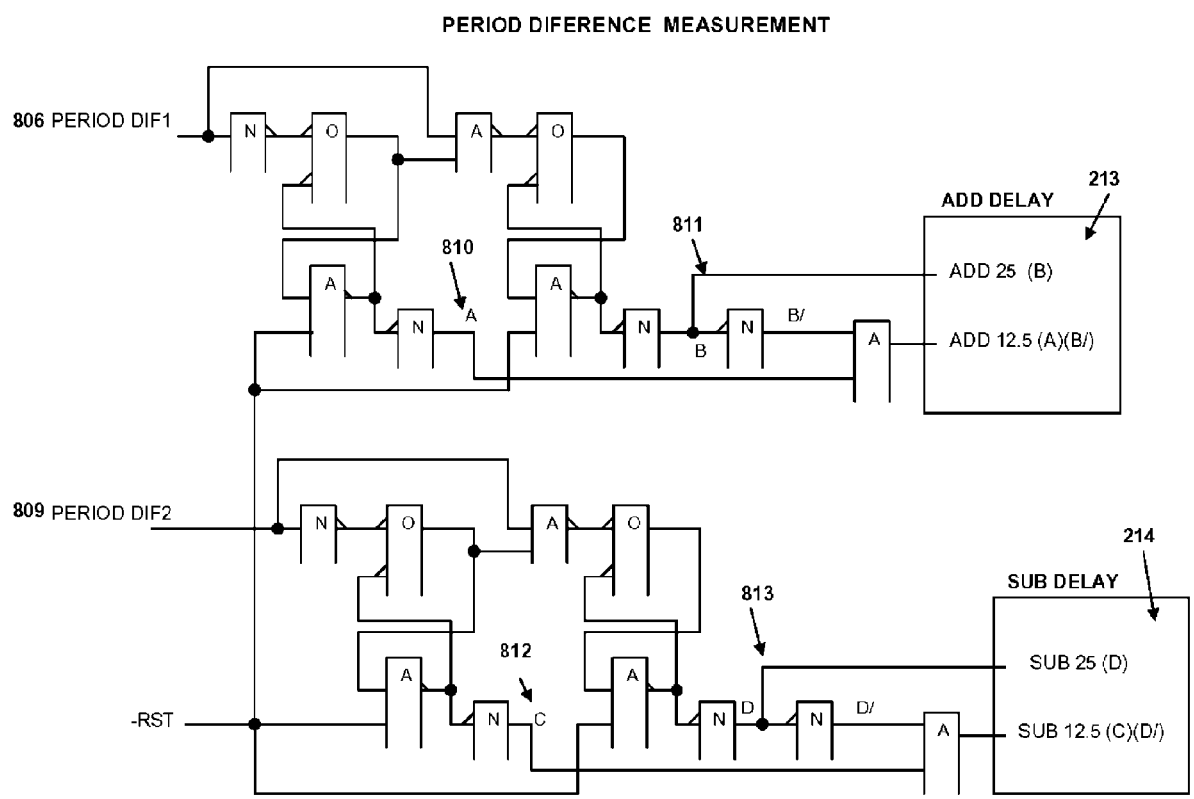
FIG. 8d depicts a collection of Set/Rest latches used to measure duration of the pulse generated by the circuits of FIG. 8c.

The number of latching elements shown in FIG. 8d could be increased, if necessary, to cover wider range of pulse widths. Furthermore, It is desirable to have the latching elements of FIG. 8d capable of resolving finer than 100 picoseconds intervals for more refined loop delay adjustment.

Period Equalization of 1×CLK 400 to 1×CK INT 801

Figure 11:
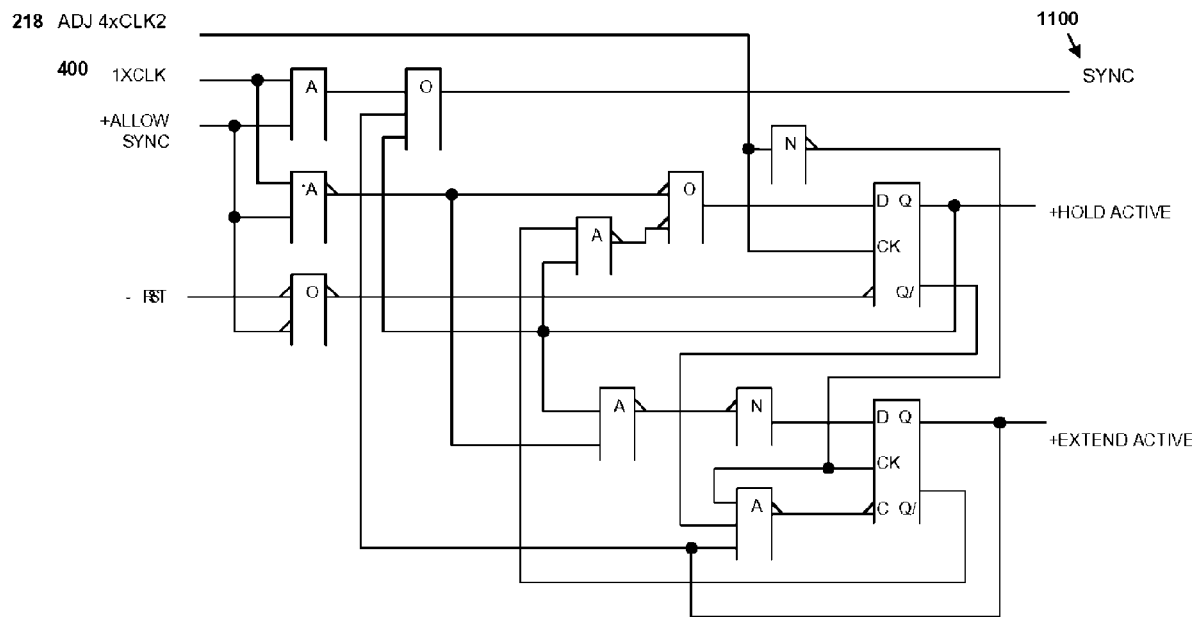
FIG. 11 depicts a circuits used to generate the SYNC pulse from the incoming 1×CLK frequency.

After the BULK and incremental delays are applied to the loop, the ring loop period will be shorter than ideal. Therefore, the INT CLK PERIOD 802 will be shorter than the CLK IN PERIOD 403. In order to correct that situation, the circuit of FIG. 11 is designed to provide a SYNC 1100 pulse shown in FIG. 11a. If the 1×CLK 400 is used to start the ring oscillator and some other means exist to maintain the oscillations, the INT CLK PERIOD 802 will continue to be shorter than CLK IN PERIOD 403 and, therefore, the oscillator will stay out of synchronization in the long run. What is needed is a restarting of the oscillator every time with the rising edge of the 1×CLK or with a signal that is produced with the rising edge of 1×CLK. A signal is required to stop the oscillator from producing its rising edge before the rise of the 1×CLK signal and allow it to restart with the 1×CLK rising edge. This signal is the SYNC 1100 and its duration shown in FIG. 11a. The Lo level of the SYNC will stop the oscillator from continuing and will restart it with its rising edge. If such control did not exist, the oscillator will go out of synchronization with the 1×CLK.

Figure 11A:
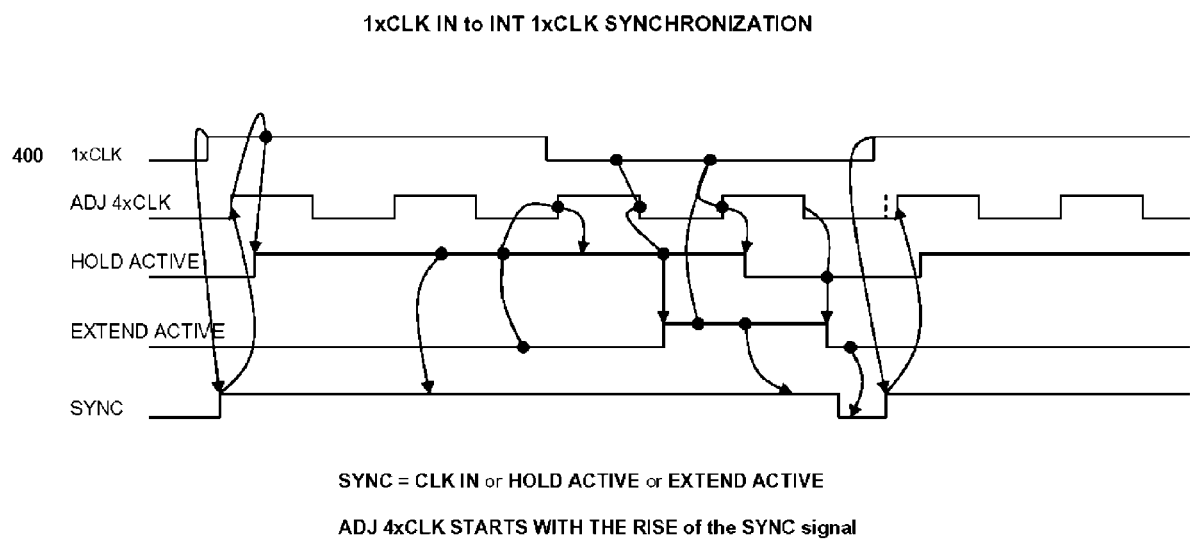
FIG. 11a depicts a timing diagram, showing the relationship of the SYNC pulse to the first 4×CLK rising edge of the circuit of FIG. 11.

FIG. 11a shows the timing relationships of signals produced by the circuit of FIG. 11.

Figure 12:
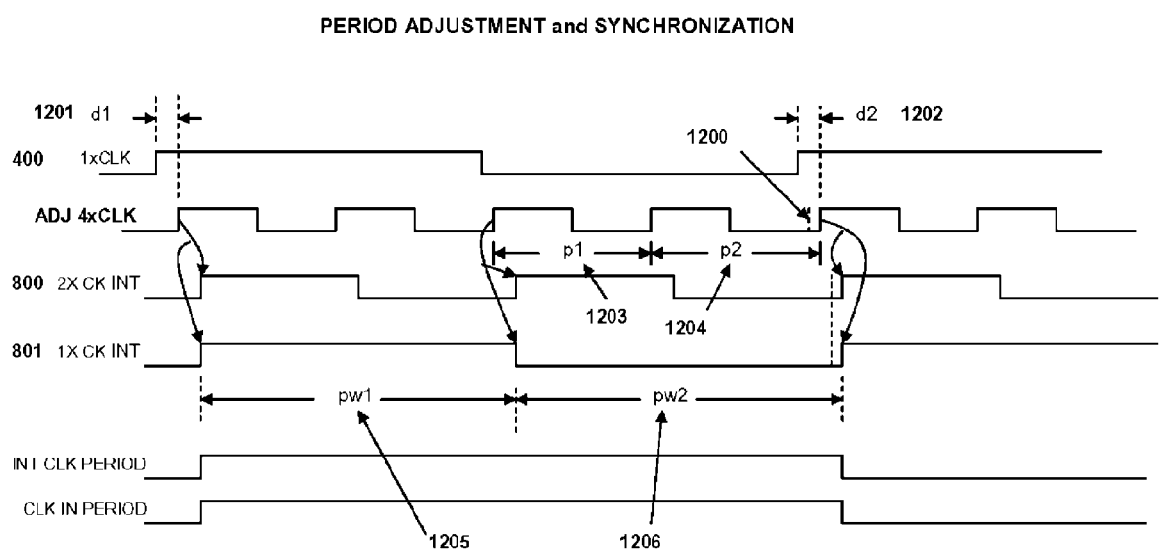
FIG. 12 depicts a timing diagram showing width of the unadjusted p1 and the adjusted p2 period widths of signals ADJ 4×CLK, as well as signal 1×CK INT.

Referring now to FIG. 12, it is assumed that the rising edge of 1×CLK, through indirect control, produces the first rising edge of the ADJ 4×CLK after delay 1201 d1. If the oscillator were free running, at point 1200 would have transitioned. Because the 1×CLK signal is low and controls the next rising edge transition of the 4×CLK, the transition will not occur until d2 1202 delay has expired. This will make the low duty cycle of 4×CLK longer and period p2 1204 longer than p1 1203 and pw2 1206 longer than pw1 1205. However, the INT CLK PERIOD 802 will equal the CLK IN PERIOD 403 in duration. Calculation would show that the asymmetry of the 1×CK INT 801 is within acceptable numbers.

Referring now to FIG. 8, an EARLY 1×CK INT 806 was generated and its timing is shown in FIG. 8a. The period of this signal is going to follow the same effects as is the period of 1×CK INT. If this early signal is fed to an output and then returned as an input signal, it can be compared to the 1×CLK 400. The phase difference can be determined by circuits similar to 8c and 8d to resolve and apply the correct delay to bring it in phase synchronization with the 1×CLK 400. Similarly, internal signals could be produced and synchronized with 1×CLK 400.

Synchronization of Outputs

Figure 13:
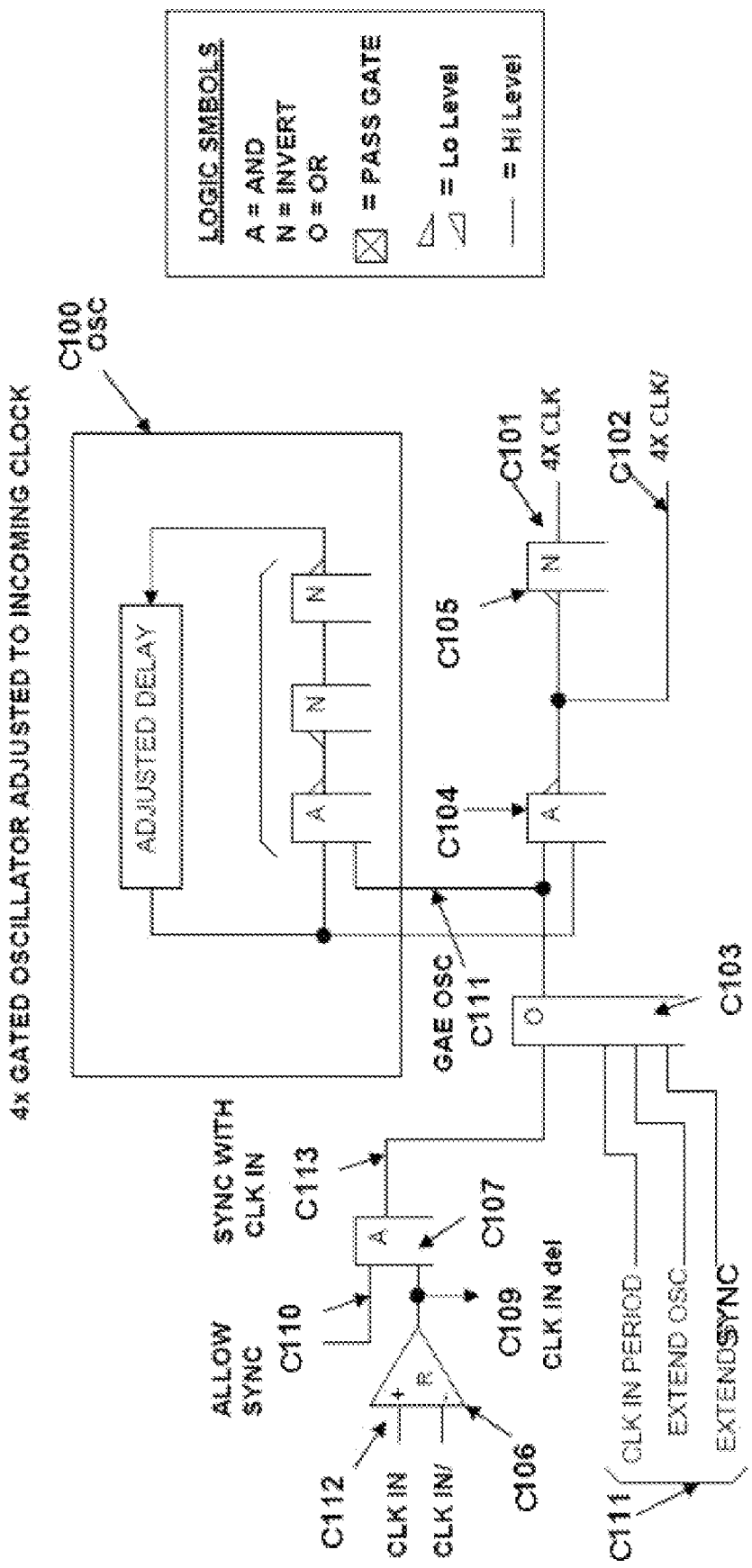
FIG. 13 depicts a block diagram of the gated digital ring oscillator and associated controls which produce the 4× or 8× high frequencies derived from the applied external 1× clock frequency.

Referring now to FIG. 13 the oscillator C100 is a high frequency digital oscillator with on-demand synchronization, as described above. It has a maximum frequency four times or eight times higher than the CLK IN C112. In this embodiment the frequency will be considered to be four times higher than the frequency CLK IN C112 as shown in FIG. 13, and is designated as 4×CLK C101.

Figure 15:
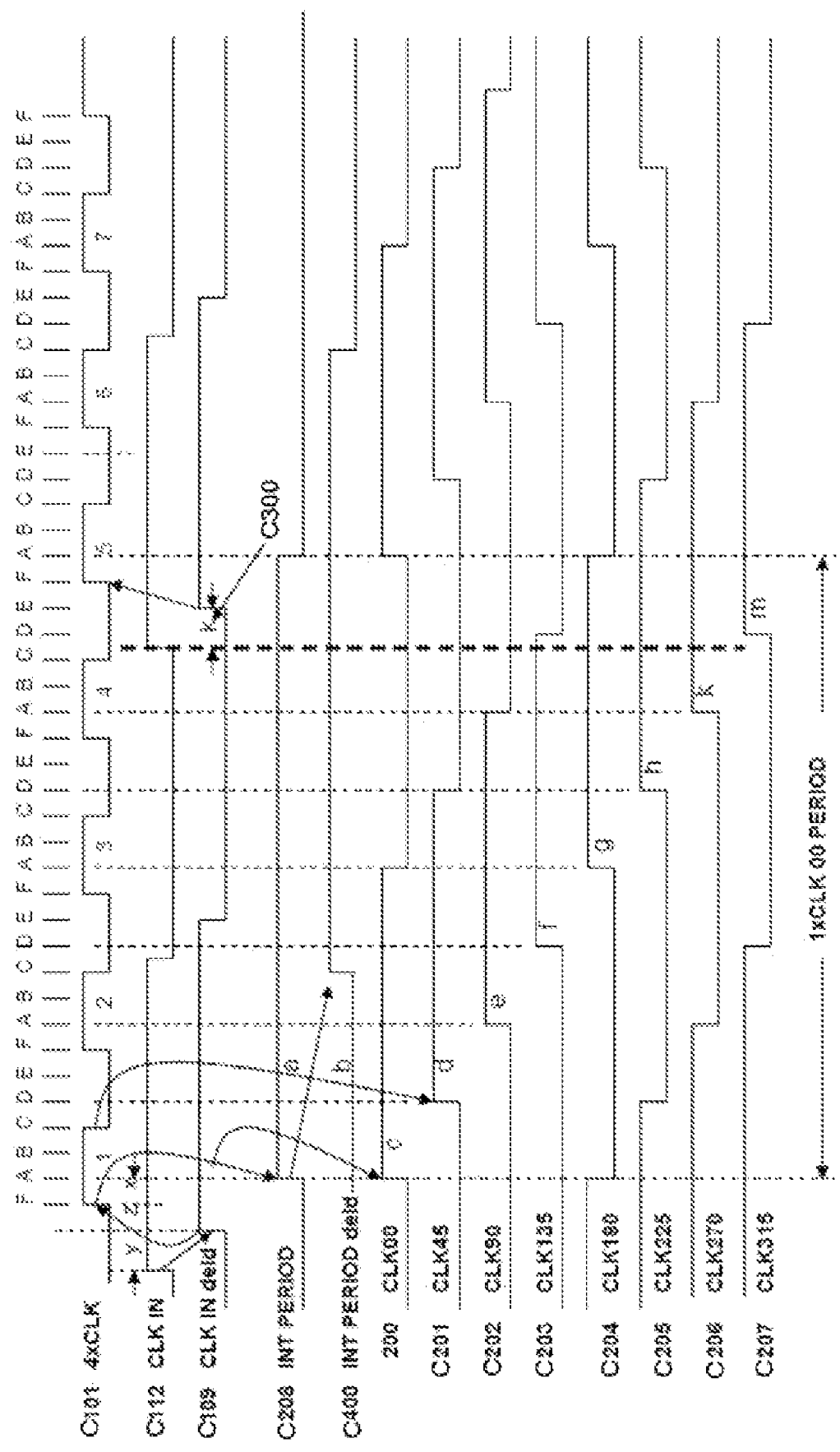
FIG. 15 depicts a timing diagram showing how periods of different clocks and phase shifted clocks relate to ring oscillator base frequency.

The Oscillator will be synchronized to the CLK IN rising edge and will have the ability to STOP/START without requiring many cycles to resynchronize. The relationship of the CLK IN frequency and the oscillator 4×CLK frequency is shown in FIG. 15. The difference in phase of the 4×CLK 101 and the CLK IN C112 is shown graphically as yz in the diagram of FIG. 15. The phase difference between the CLK IN C112 and the equivalent internal clock CLK 00 C200 in FIG. 15 is shown as DELAYX1 C108 in FIG. 13. All other logic functions shown in FIG. 1 should be easily understood. The fundamental relationship of the CLK IN C112 and 4×CLK C101 will serve the basis for the invention along with other controlled parameters. DELAYX1 C108 will vary from silicon to silicon due to process and during operation when it is exposed to voltage and temperature variations. Any other oscillator having similar properties is considered as part of this invention.

Figure 14:
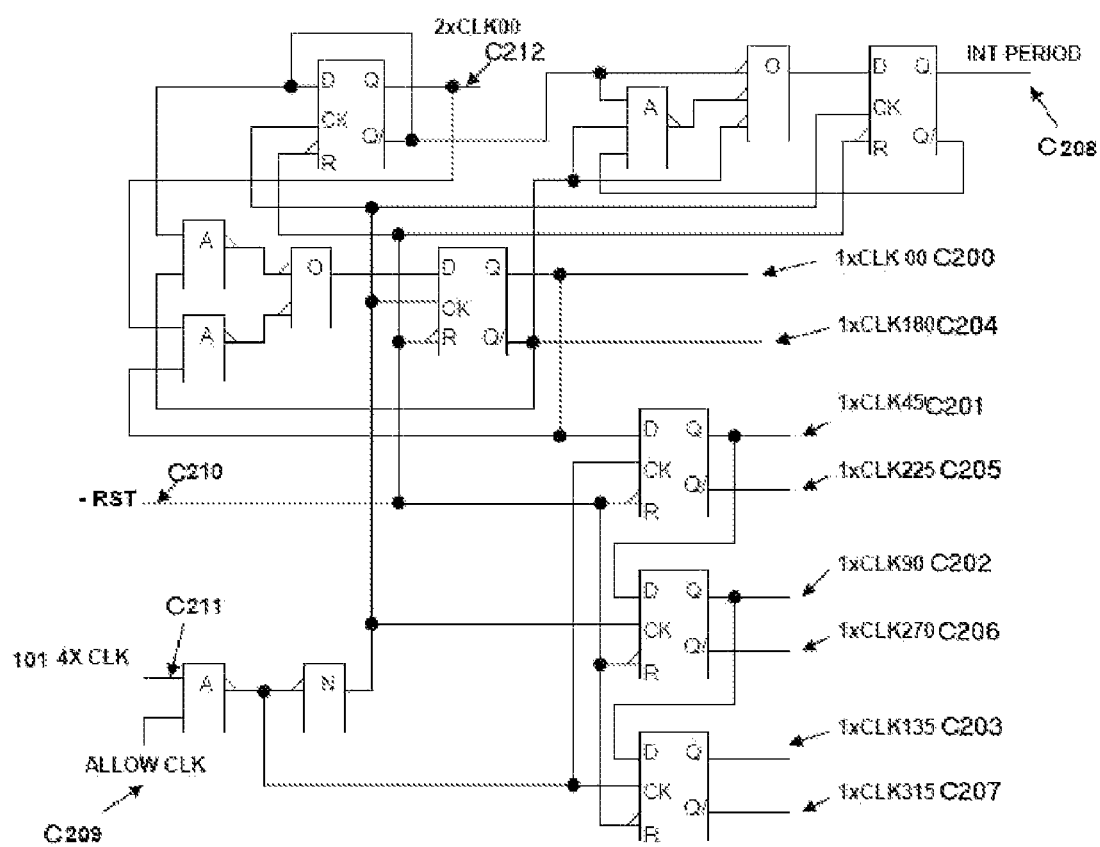
FIG. 14 depicts a base ring oscillator frequency divider and phase shifter logic which produce phase shifted clocks every 45 degrees.

Referring next to FIG. 14 it may be seen that the 4× oscillator frequency is digitally divided by 2 to generate the 2×CLK00 C212 and divided by 4 to generate the 1×CLK00 C200 and its INT PERIOD C208. The phase shifted clocks 1×CLK45 C201, 1×CLK90 C202, 1×CLK135 C203, 1×CLK180 C204, 1×CLK225 C205, 1×CLK270 C206, 1×CLK315 C207 are generated every 45 degrees or ⅛ cycle of the 1×CLK00 C200 period. The 45 degree time from phase to phase will be different for each CLK IN frequency. One of the 1×CLK00 C200 phase shifted clocks, applied through delay adjustments, is used to clock the output drivers for DQ OUT synchronization or to produce multiple copies of the CLK IN signal to drive other distant devices and maintain phase synchronization with the CLK IN C112.

Referring next to FIG. 15 the timing diagrams of the signals produced and shown in FIG. 14 are shown herein.

In the first embodiment of the invention, the objective is to clock data drivers of a silicon device with a delayed phase of an applied input clock so that the data at the output pin of the device is in some specified phase relationship to the incoming clock phase. Ideally, the phases should be the same, but that cannot be guaranteed due to many variables in the silicon, power supplies and operating temperatures.

Figure 15A:
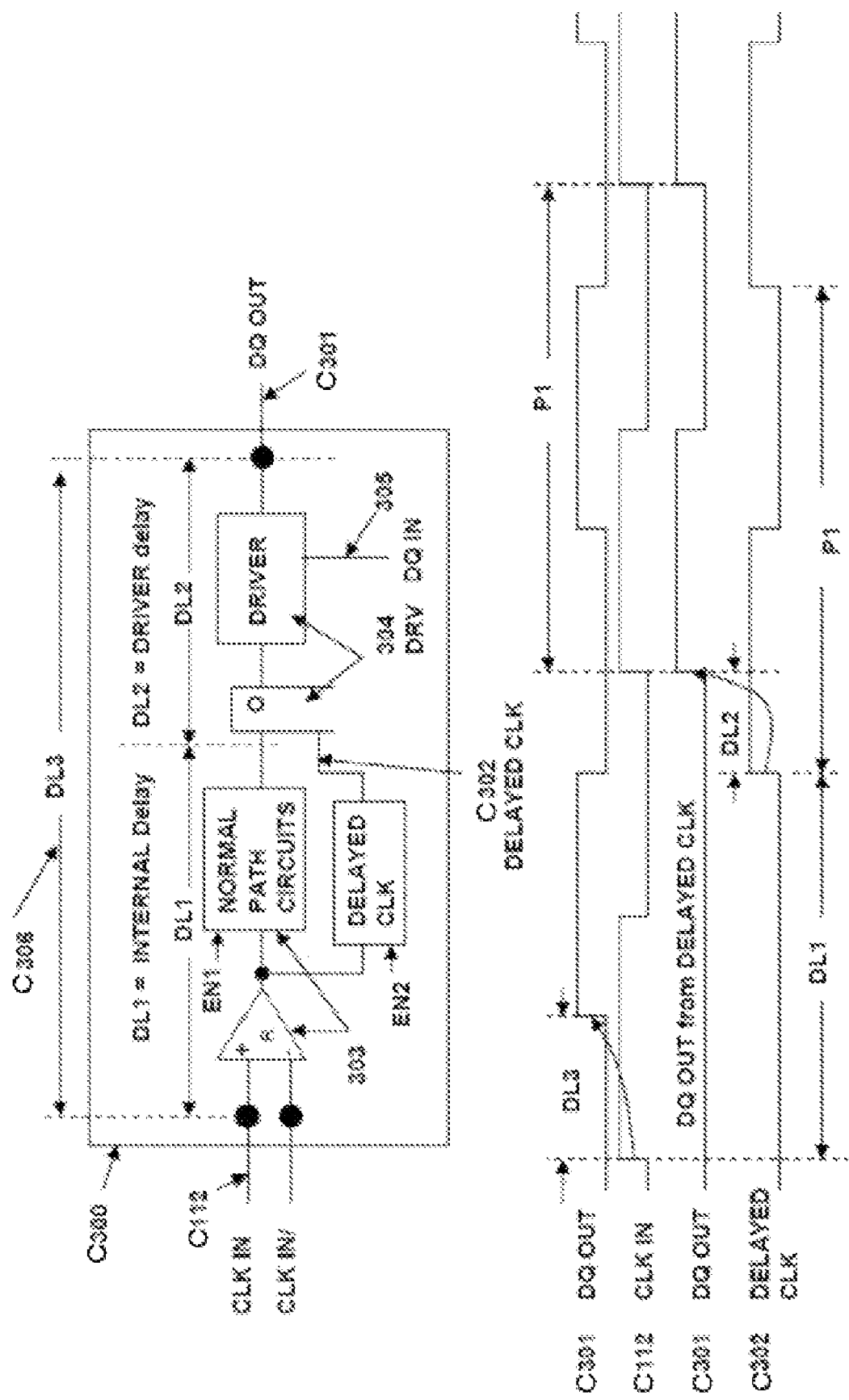
FIG. 15A depicts a block diagram showing the CLKIN and DQ OUT and the internal delay paths along with a timing diagram showing phase alignment between the CLKIN and DQ OUT.

Referring next to FIG. 15A the device C300 is shown in its simplistic block diagram form. A CLK IN C112 is required to synchronize the internal functions to produce data output signals in synchronized phase relationships. A driver DRV C304 receives a data input DQ1 C305 signal. The output of the driver DQ OUT C301 must be in phase with the CLK IN C112 within acceptable measure for proper operation, and the maintenance of this phase is described below. The propagation of the CLK IN C112 within a normal internal path C303 circuits will clock the driver and produce the DQ OUT C301 after delay DL3 C306. The output will be out of phase with the incoming clock as shown in the timing diagram. If a delayed clock C302 is applied to the driver after delay DL1, the DQ OUT C301 will be in phase with CLK IN C112, as described below. Selection of the paths is accomplished by the EN1 and EN2 signals.

Figure 16:
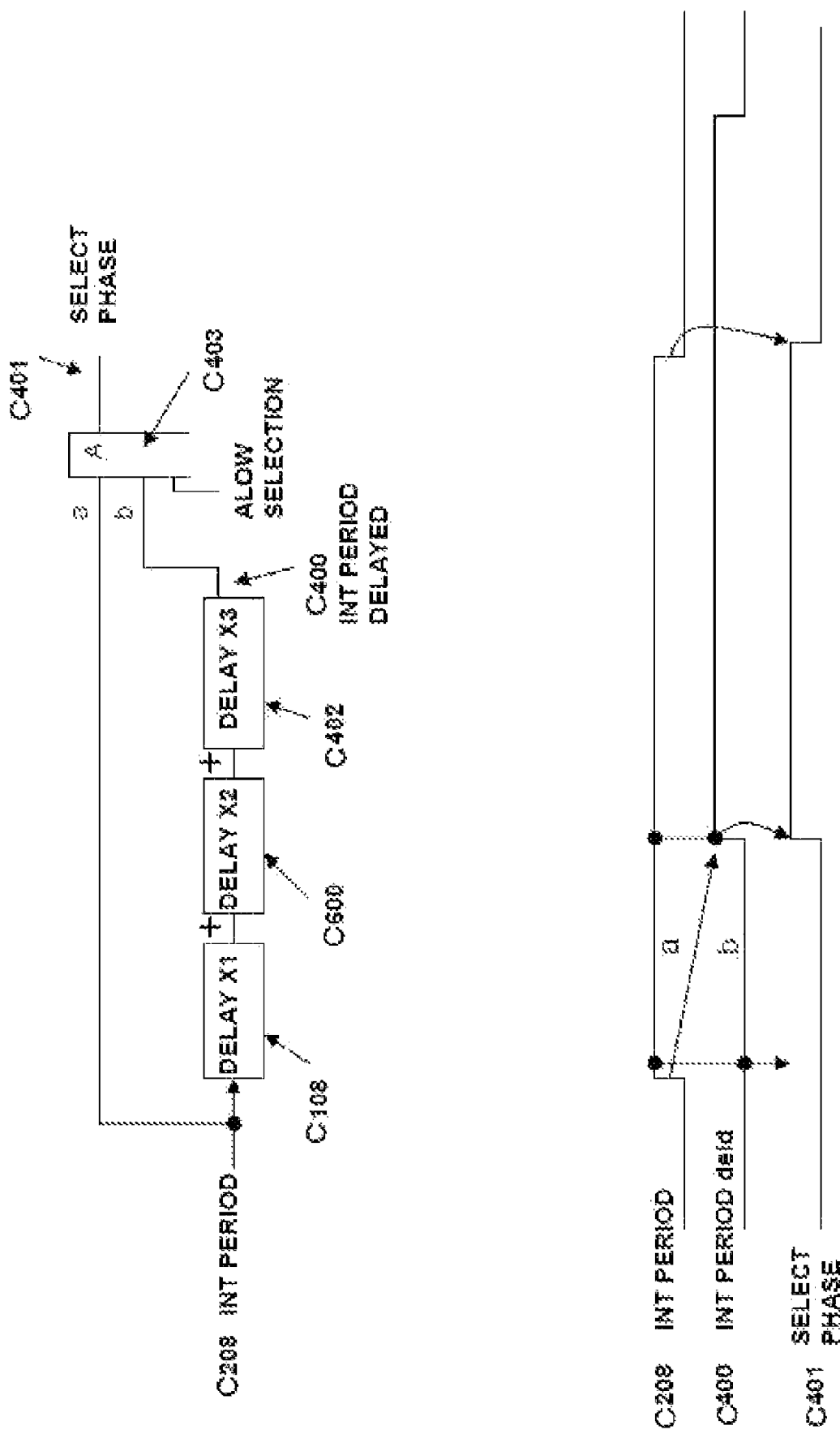
FIG. 16 depicts a signal applied to a basic delay circuit and to an AND circuit to produce a timing signal for phase selection.

Referring next to FIG. 16 it may be seen that INT PERIOD C208 feeds two paths: one path is connected to one input of AND gate C403 at point (a) and the other path at point (b) after a series of delay elements labeled DELAY X1 C108, DELAY X2 C600 and DELAY X3 C402. DELAY X1 C108 and DELAY X3 C402 account for the total propagation delay from the CLK IN C112 pin to the input of the driver gate C611 at point C602 after the INCREMENTAL DELAY C607 has been selected. Initially, the INCREMENTAL DELAY C607 is assumed to be zero in order to select the proper phase clock. The produced output signal SELECT PHASE C401 of gate C403 is used to clock and latch the selected phase clock of FIG. 17. The selected phase clock must appear at the input of gate C611 at point C602 earlier than the expected DQ OUT 604 by an amount of time equal to the delay of the driver DELAY X2 C600. The selection of incremental delay will fine adjust the phase clock to appear at the proper time at point C602.

Figure 17:
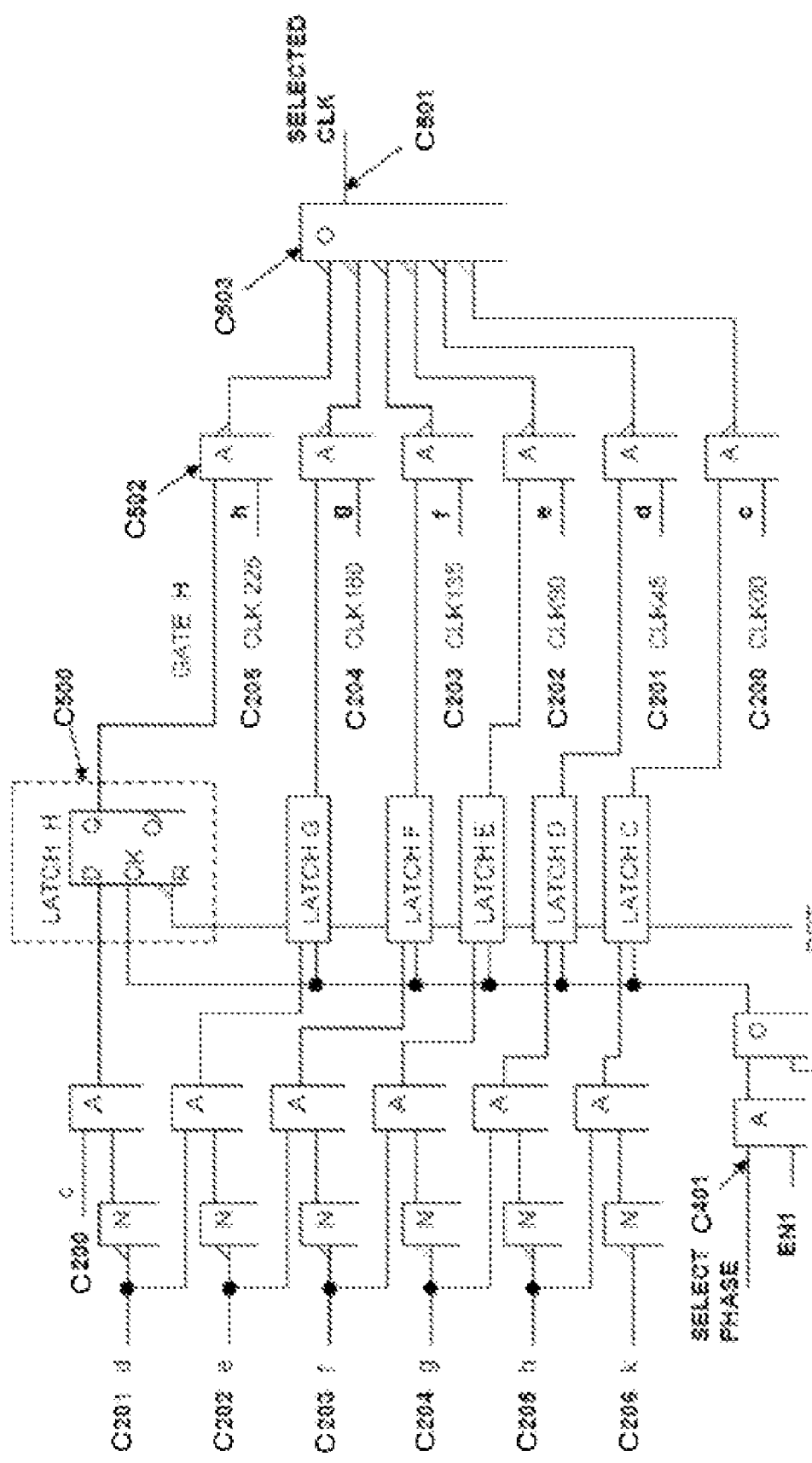
FIG. 17 depicts a digital logic implementation for phase clock selection.

The rising edge of the SELECT PHASE C401 is used to clock the appropriate latch C500 of FIG. 17. The latch will be set if the data input to the latch is Hi level at the time the rising edge occurs. The data input to each latch is dependent on the Boolean expression implemented in gates as shown. A typical such Boolean expression is (c)/(d), as shown for LATCH H C500. Referring next to FIG. 15 a timing diagram is shown, together with a logic implementation of FIG. 17.

Phase selection is implemented by use of a predetermined algorithm. For devices of the zero delay buffer type, an earlier phase may be required in comparison to the one for the synchronized data output.

The selected clock phase must be such that its propagation through the selection gates C502 and C503 of FIG. 5 plus the delay C609 and selected incremental delay C607 of FIG. 6 arrives at the input of gate C611 a time ahead of the next rising edge of CLK IN C112 equal to the DELAYX2 C600.

The selected phase accounts for the delay from CLK IN C112 to the selected phase rising edge. It tracks frequency changes and is not affected by logic gate delay changes because all phases of the generated clocks are based on the 4×CLK edges which are fixed for the selected frequency.

Figure 18:
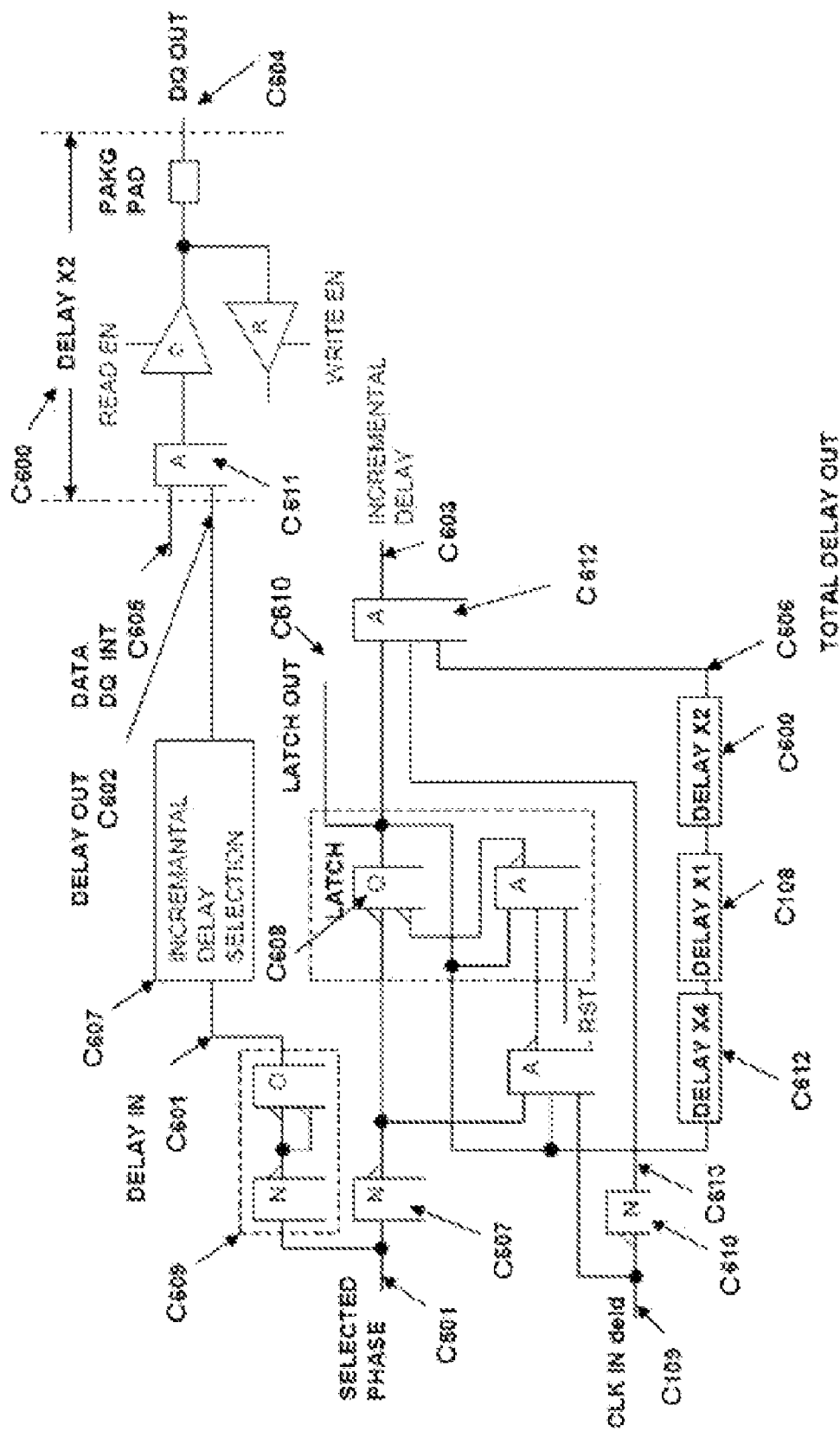
FIG. 18 depicts a digital logic implementation for incremental delay determination and delay selection.

Referring next to FIG. 18 it may be seen that the clock phase selected going through selection gates C502, C503 and C609 will be ahead of the next rising edge of the CLK IN by an amount greater than the DELAYX2 C600 if there is no incremental delay added to the path. The required incremental delays are determined by the circuits depicted in FIG. 18.

Figure 19:
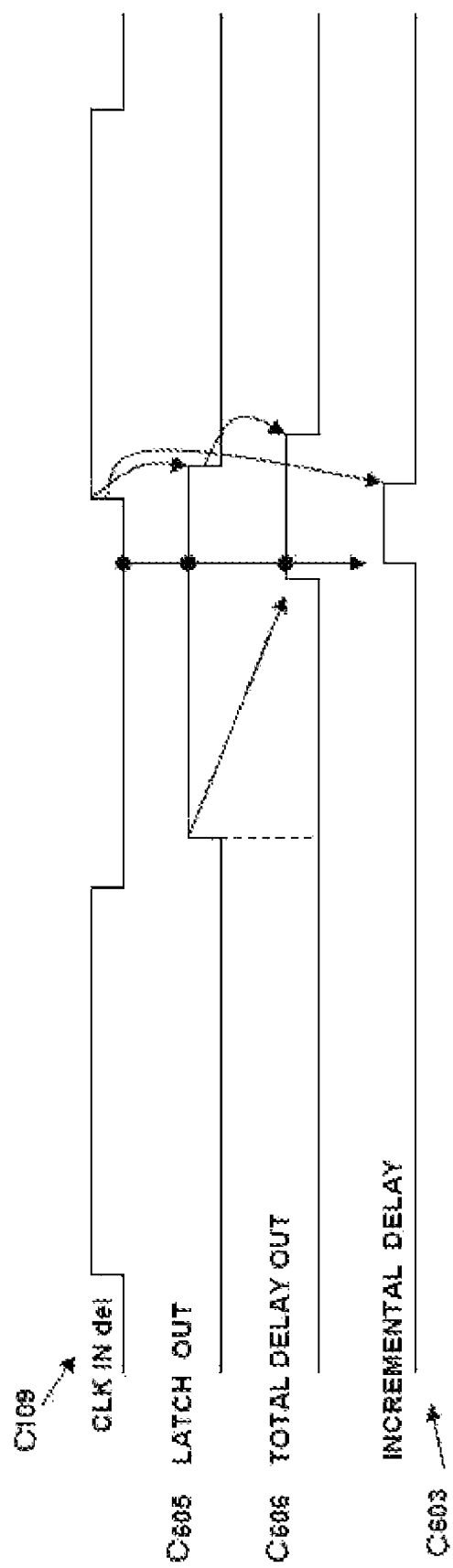
FIG. 19 depicts a timing diagram showing the incremental delay pulse generation.

Referring now to this figure, the selected clock phase is used to produce the signal LATCH OUT C605. This signal is run through a series of delays DELAY X4 C612, DELAY X1 C108 and DELAY X2 C600 to produce the signal TOTAL DELAY OUT C606. The AND function C612 of the LATCH OUT C605, the TOTAL DELAY OUT C606 and the inverted CLK IN deld C109 signals C613 will produce the INCREMENTAL DELAY C603 pulse shown in FIG. 19.

The gates of C609 are identical to gates C607 and C608 to account for the delay it takes to produce the signal LATCH OUT C605.

The next step is to quantize the width of the INCREMENTAL DELAY pulse C603 in terms of time delay to be represented by gate delays.

Figure 20:
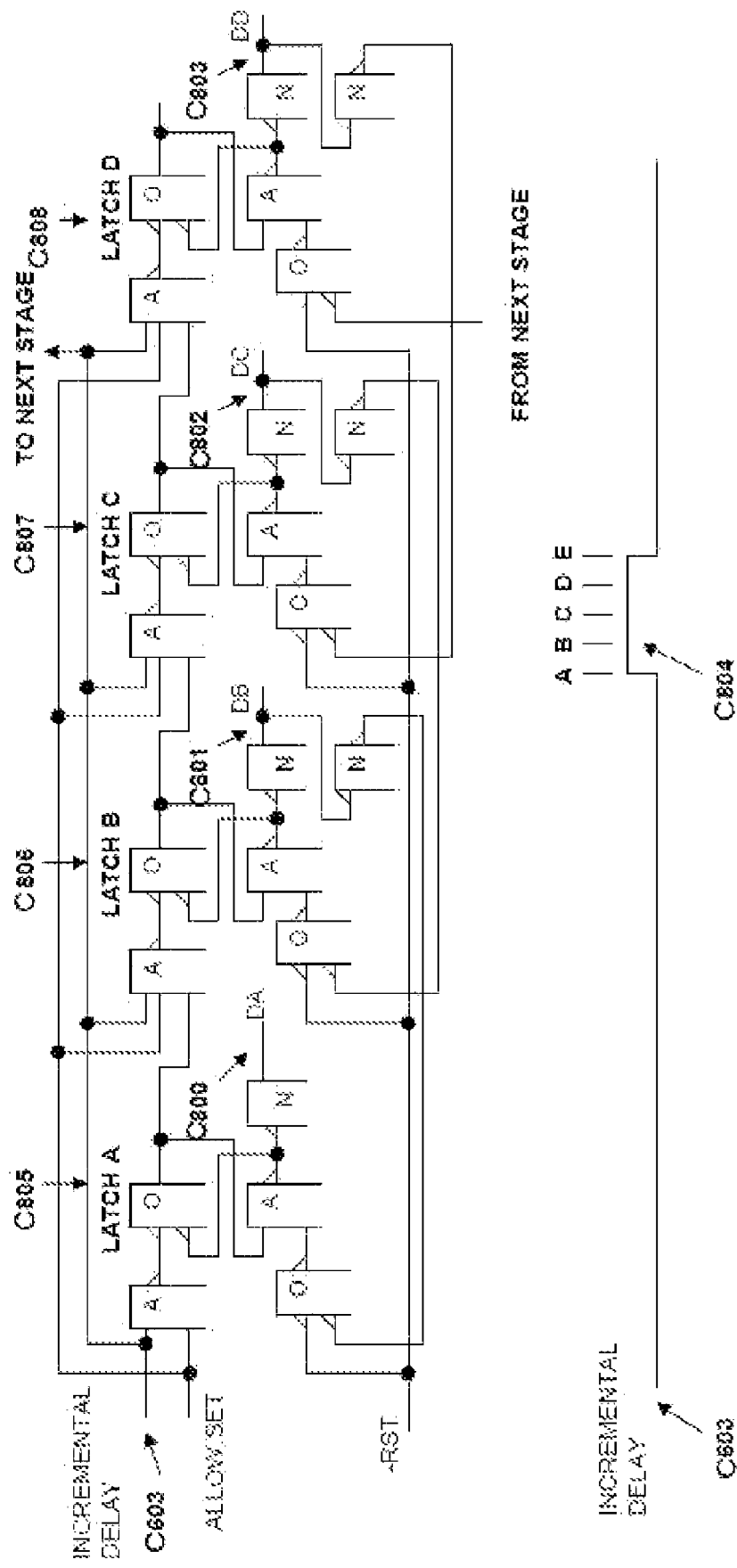
FIG. 20 depicts a collection of Set/Rest latches used to measure duration of the incremental delay pulse.

Referring next to FIG. 20 the INCREMENTAL DELAY pulse C603 is applied to a series of SET/RESET latches C805, C806, C807 and C808 as shown. The time required to set each latch is dependent on the speed of the gates of the silicon process and internal wiring parasitics. Once the pulse is applied, each latch will be set in succession. As each latch is set the previous one is reset. At the end of the process there will only be one latch set. Each latch, when set, will be used to select a delay in the delay tree C902 shown in FIG. 21.

Figure 21:
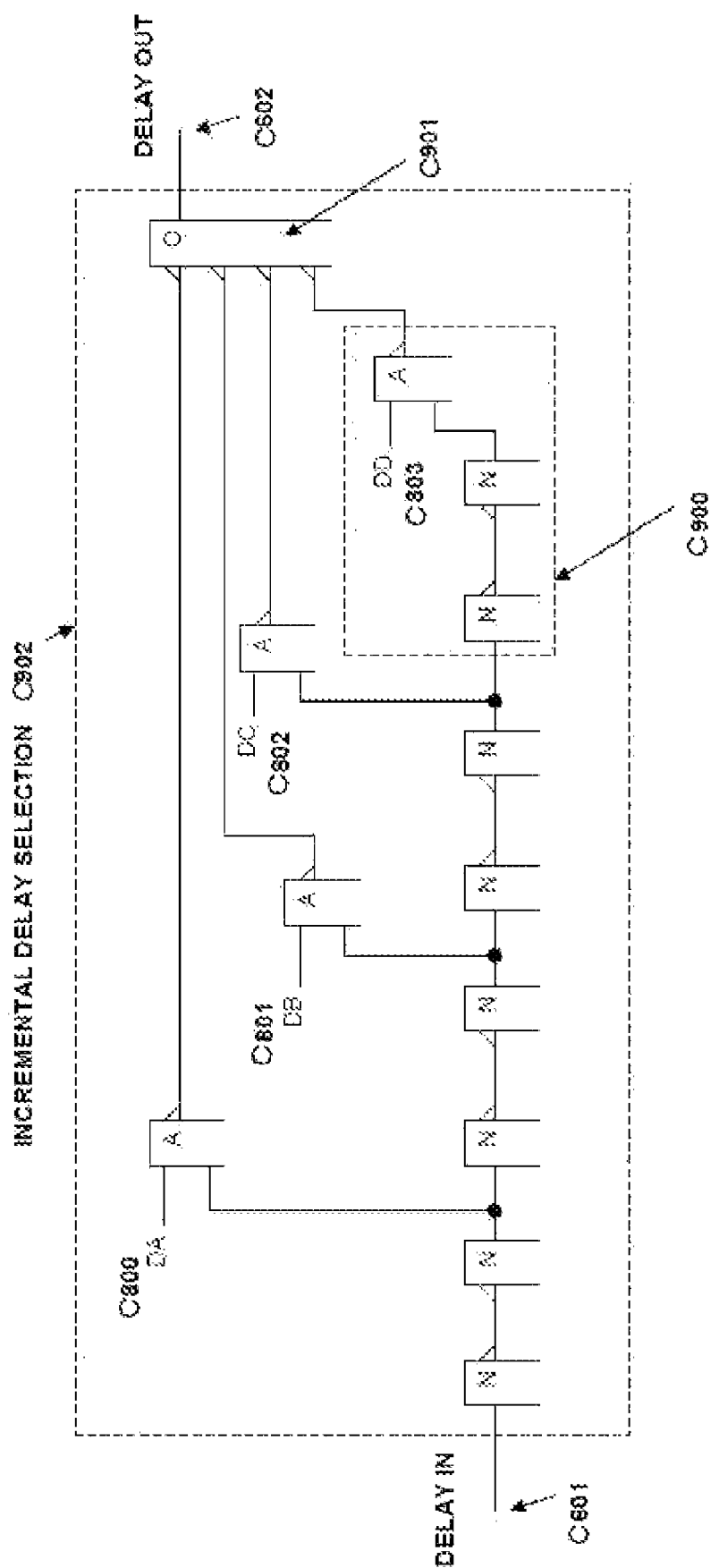
FIG. 21 depicts a delay tree with delays selected by the latches of FIG. 20 which measure the incremental delay pulse duration.

Referring next to FIG. 21 it may be seen that each delay section C900 will represent a delay number based on the speed of the gates used (if it is implemented with gates—delays may also be implemented in passive form, if desired). The selected delay will fine adjust the path so that the selected clock phase arrives at the input C602 of the driver gate C611 at the predetermined time so that the DQ OUT C604 rising edge aligns to the rising edge of the CLK IN C112. The number of delay arrangements C900 depends on the number of latches implemented in FIG. 20. In the example shown, latch output C803 will select the total delay string. The total selected delay consists of all the delay sections from the DELAY IN C601 input to the output of the OR gate C901.

The delay sections are defined to meet requirements based on silicon process speed. There will be a nominal, a minimum and a maximum speed variation from device to device and from lot to lot manufactured. If the device is slow, each delay section in the tree C902 will produce a longer delay and each latch in FIG. 20 will take longer to set, thus resulting in longer delay value.

Figure 22:
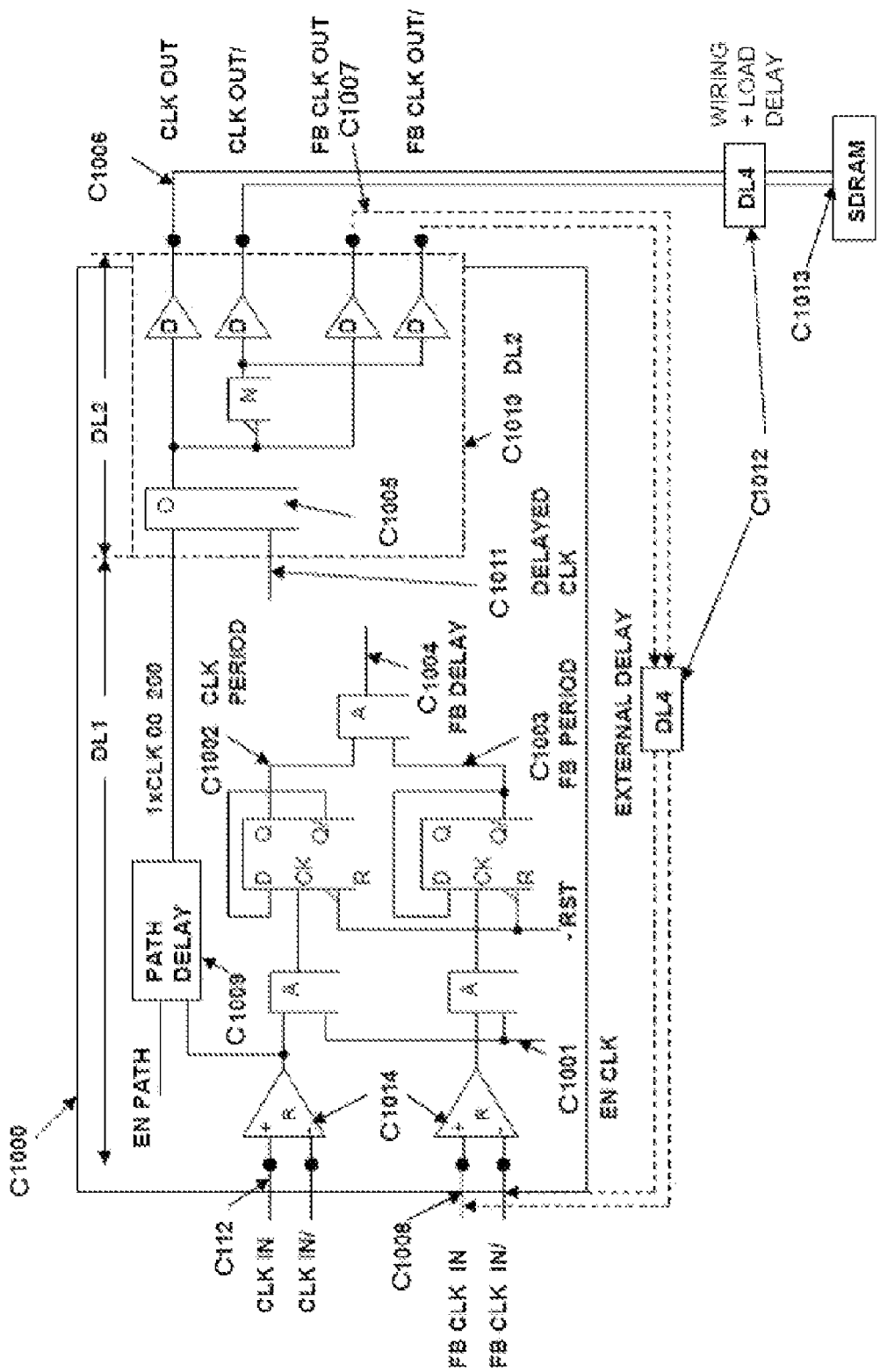
FIG. 22 depicts a block diagram of clock paths for CLK IN and the clock driving an external device.

Referring next to FIG. 22, it is seen that in a second embodiment of the invention, a silicon device C1000 takes the input CLK IN C112 and produces outputs (multiple copies) CLK OUT C1006 and a FB CLK OUT C1007 for feedback. Outputs C1006 are fed to the input C1013 of devices, such as SDRAM, at distant points.

There is also a delay DL4 C1012 from CLK OUT C1006 to the input of SDRAM at point C1013 due to wiring and printed circuit board parasitics. In any event, the clock at the input of SDRAM at point C1013 and the CLK IN C112 are phase aligned for this circuitry to perform properly.

The CLK OUT C1006 and the CLK IN C112 are phase aligned according to the first embodiment and the methods and circuits described above. Then, the DELAYED CLK C1011 is further adjusted so that it appears earlier by an amount of time equal to the delay DL4 C1012.

Figure 22A:
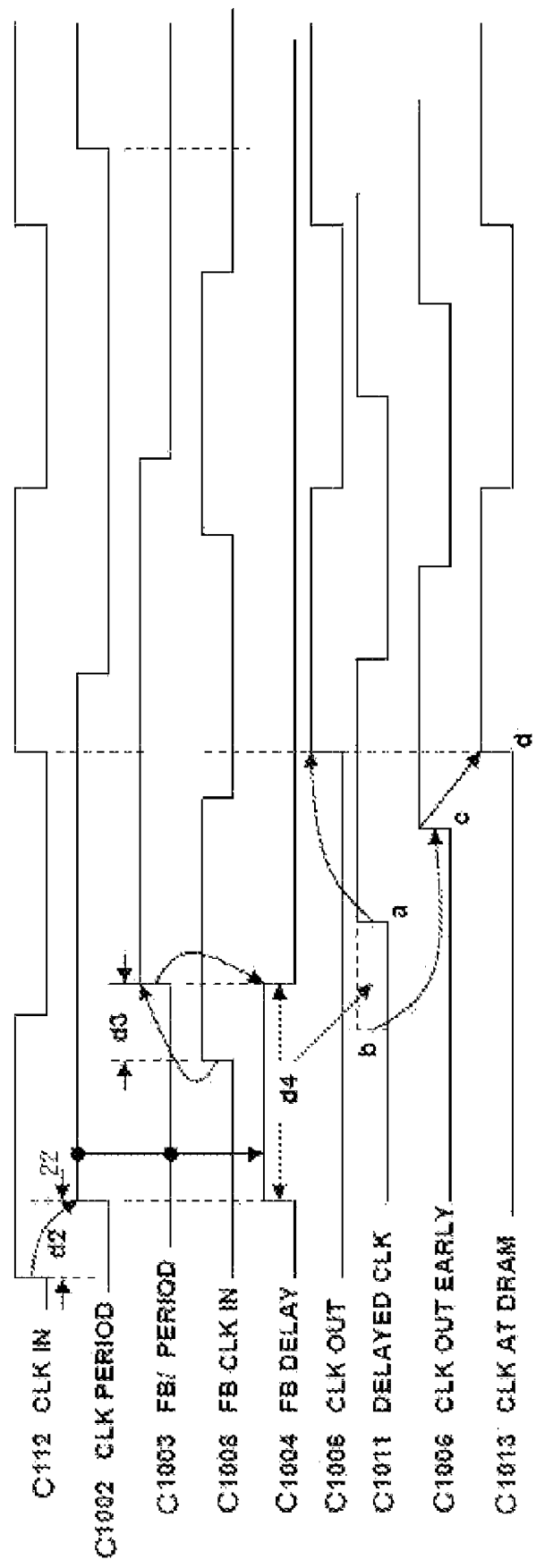
FIG. 22a depicts a timing diagram of the circuit of FIG. 22.

Referring next to the block diagram FIG. 22 and timing diagram FIG. 22A the value of DL4 C1012 is determined.

The delay DL4 C1012 from the CLK OUT C1006 to the SDRAM device input C1013 is duplicated and applied to the path from the FB CLK OUT C1007 to the input FB CLK IN C1008. The receivers C1014 and the paths for CLK PERIOD C1002 and FB PERIOD C1003 are identical. When both period signals are ANDed, a FB DELAY C1004 pulse is created as shown in FIG. 22A as d4. This pulse is converted to time delay by applying it to a circuit similar to the one shown in FIG. 20 and by selection of the delay from the delay tree of FIG. 21.

The number of elements in FIG. 20 and FIG. 21 may have to be increased in order to accommodate all the delay adjustments required. The amount of delay determined will be subtracted from the delay originally selected to have the CLK OUT C1006 in phase with the CLK IN C112. The delay selected is saved and is applied as coarse delay adjustment for the feedback loop.

After the initial coarse delay adjustment, there will be a shorter FB DELAY C1004 pulse created. This pulse is further applied to another circuit similar to the one in FIG. 20 for further fine delay adjustment. Ideally, there shouldn't be any FB DELAY C1004 pulse created after all the adjustments, depending on the techniques used to resolve the FB DELAY C1004 pulse duration. The remaining pulse will represent the phase difference of the CLK IN C112 and the CLK OUT at C1013 of the SDRAM. This phase difference must be within acceptable measure. This fine delay adjustment may be dynamically tested every clock cycle to continuously synchronize the clocks. Alternatively it may be tested in longer time intervals.

The proposed synchronization methods can be applied to devices other than zero buffer types. In fact, all memory devices, whether dynamic, static or flash may be synchronized by use of this technique, whether used in memory controllers or in CPU's.

It will be apparent that improvements and modifications may be made within the purview of the invention without departing from the scope of the invention defined in the appended claims.

What is claimed is:

1. A method for synchronizing an output signal of a device so as to be phase aligned with an input clock signal comprises the steps of:
 a) providing an oscillator signal having a period $\Pi n$ of $1/(f1*2^n)$, wherein n is an integer, wherein f1 is the clock frequency, and wherein the oscillator signal is phase aligned with the input clock signal;
 b) generating a multiplicity of delayed signals sdk, where k is an integer, each delayed signal having the same period $\Pi c$ as the input clock signal, wherein delayed signal sd1 is delayed by one-half the oscillator period $\Pi n$ from the input clock signal, and wherein delayed signal sd(k+1) is delayed by one-half the oscillator period $\Pi n$ from delayed signal sdk for each value of k;
 c) measuring the phase difference $\Delta\Phi k$ between an unadjusted output signal and the delayed signal sdk for each value of k;
 d) determining which value of k, equal to km, resulted in the smallest positive value of $\Delta\Phi k$ measured;
 e) adding a coarse delay time $\Delta\tau 1$ to the clock signal equivalent to the smallest positive value of $\Delta\Phi k$ measured, creating a delayed clock signal thereby;
 f) generating a new output signal, delayed by time $\Delta\tau 1$ from the output signal, by use of the delayed clock signal.

2. The method of claim 1, wherein the phase alignment of the oscillator signal with the input clock signal is effected by aligning a rising edge of the oscillator signal with a rising edge of the input clock signal.

3. The method of claim 1, wherein generating the output signal further comprises gating it.

4. The method of claim 1, further comprising generating a fine delay time by the steps of:
 (a) determining the phase difference $\Delta\Phi k2$ between the new output signal and the delayed signal sdk corresponding to k=km;
 (b) calculating fine time delay $\Delta\tau 2$, equivalent to the phase difference $\Delta\Phi k2$; and
 (c) adding a delay of $\Delta\tau 2$ to the delayed clock signal.

5. The method of claim 3, wherein generating of the fine delay time further comprises passing the output signal through a delay tree.

6. The method of claim 5, wherein generating the fine delay time further comprises selecting the branches of the delay tree which produces the delay closest in magnitude to $\Delta\tau 2$.

7. The method of claim 6, wherein the delay tree further comprises a multiplicity of gates of preselected delay characteristics with a multiplicity of selection taps.

* * * * *

UNITED STATES PATENT AND TRADEMARK OFFICE
CERTIFICATE OF CORRECTION

PATENT NO. : 7,561,651 B1  
APPLICATION NO. : 11/733254  
DATED : July 14, 2009  
INVENTOR(S) : Chris Karabatsos Page 1 of 1

It is certified that error appears in the above-identified patent and that said Letters Patent is hereby corrected as shown below:

ON THE FACE OF THE PATENT

Item (60), under Related U.S. Application Data, insert:

--Provisional application No. 60/797,172, filed on May 4, 2006; Provisional application Nos. 60/666,603, filed on March 31, 2005 and 60/670,618, filed on April 13, 2005.--

IN THE SPECIFICATION

Column 1, delete lines 6-17 under Prosecution History and insert the following:

--This application is a CIP of U.S. patent application Ser. No. 11/308,518, filed March 31, 2006 for a "High Frequency Digital Oscillator-on-Demand with Synchronization", which claims priority to Provisional Patent 60/666,603 filed on March 31, 2005, for "High Speed Digital Oscillator-on-Demand with Synchronization", and also Provisional Patent 60/670,618, filed April 13, 2005, for "I/O Output to Clock Edge Synchronization." The present application also claims priority to Provisional Patent 60/797,172, filed May 4, 2006, for "Synchronization of a Data Output Signal To an Input of a Device; Of an Input Clock To an Output Clock Applied to a Distant Device On a Printed Circuit Board Without Use of DLL or PLL Analog Techniques."--

Signed and Sealed this
Eighth Day of November, 2011

David J. Kappos
*Director of the United States Patent and Trademark Office*